United States Patent [19]

Yoshida et al.

[11] Patent Number: 4,536,716

[45] Date of Patent: Aug. 20, 1985

[54] STEREO AMPLIFIER CIRCUIT FOR BICHANNEL SIGNALS

[75] Inventors: Yoshihiro Yoshida, Yokohama; Hidehiko Aoki, Fujisawa, both of Japan

[73] Assignee: Tokyo Shibaura Denki Kabushiki Kaisha, Kawasaki, Japan

[21] Appl. No.: 560,114

[22] Filed: Dec. 12, 1983

[30] Foreign Application Priority Data

Dec. 13, 1982 [JP] Japan ................................ 57-218059

[51] Int. Cl.³ .............................................. H03F 3/45
[52] U.S. Cl. ....................................... 330/69; 330/84; 330/147; 330/148; 330/252; 330/295
[58] Field of Search ................ 330/252, 295, 84, 147, 330/148, 69; 333/81 R; 455/103

[56] References Cited

FOREIGN PATENT DOCUMENTS 2020232 3/1979 Fed. Rep. of Germany ...... 330/295

Primary Examiner—James B. Mullins
Assistant Examiner—Steven J. Mottola
Attorney, Agent, or Firm—Cushman, Darby and Cushman

[57] ABSTRACT

A stereo amplifier circuit which comprises a first circuit responsive to a first input signal and to a second input signal for generating a first output signal which corresponds to the potential difference between the first and second input signals, a second circuit responsive to the first and second input signals for generating a second output signal which corresponds to the potential difference between the second and first input signals, a third circuit responsive to the first and second input signals for generating a third output signal which corresponds to the sum of the first and second input signals. The third output signal contains signal components being antiphasic to the first and second input signals. An output terminals are coupled to the first to third circuit, which are used for providing a first differential output signal corresponding to the potential difference between the first and third output signals, and providing a second differential output signal corresponding to the potential difference between the second and third output signals.

17 Claims, 30 Drawing Figures

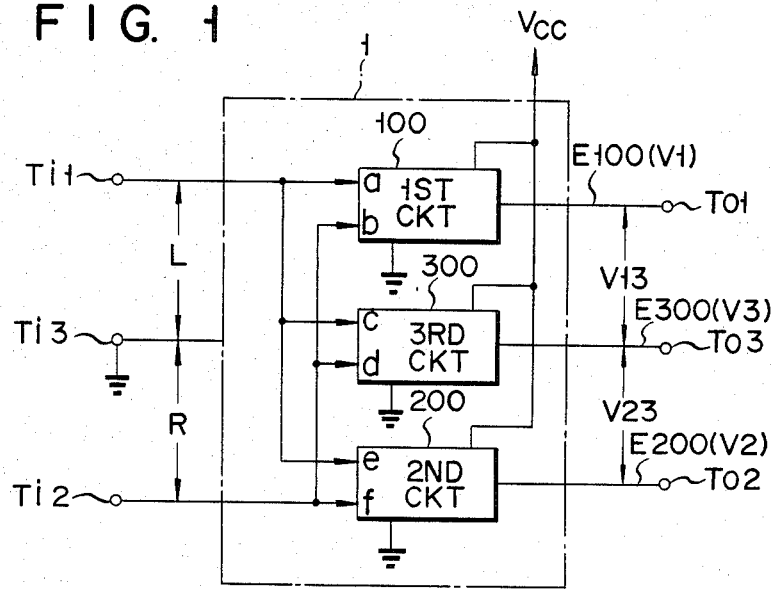
F I G. 1
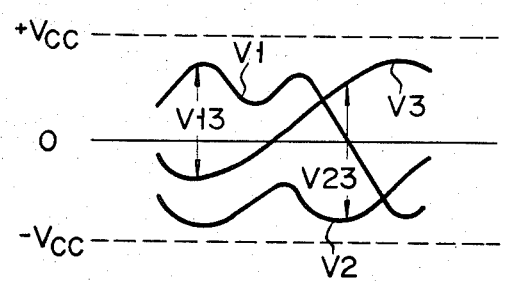
F I G. 2

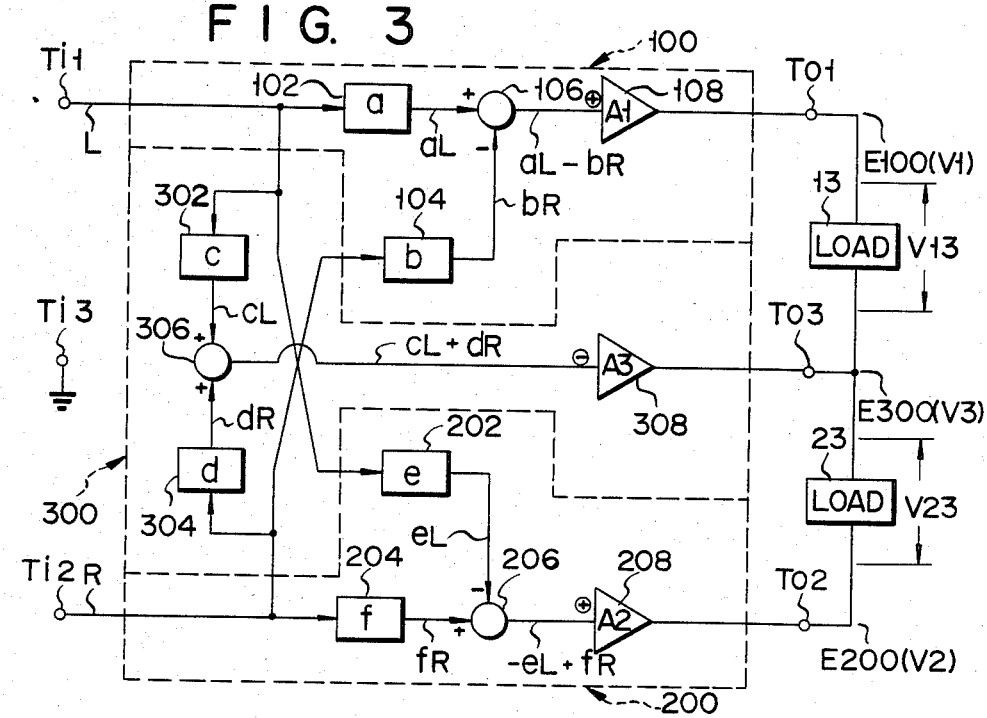
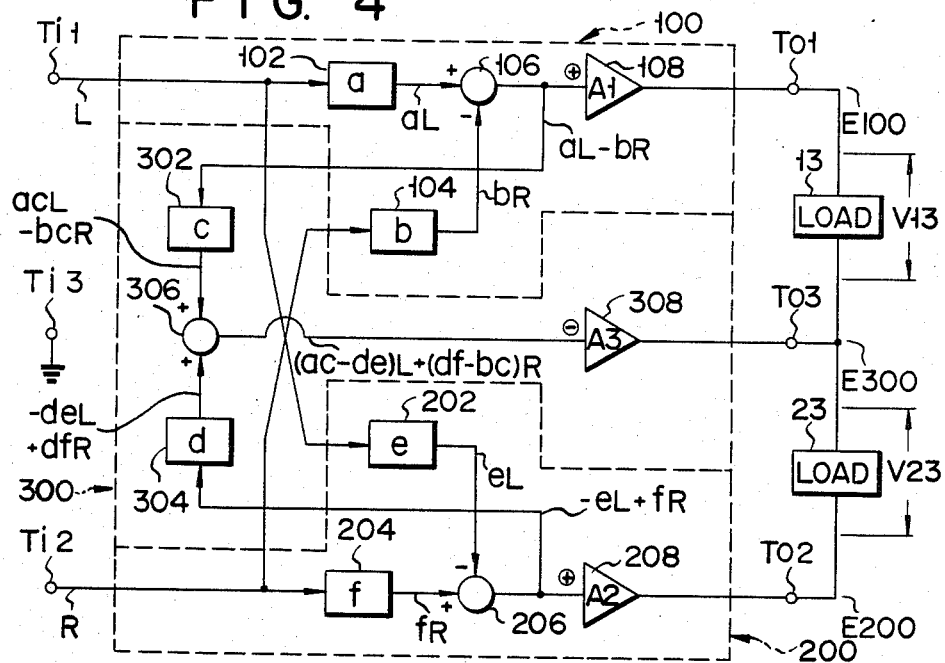

STEREO AMPLIFIER CIRCUIT FOR BICHANNEL SIGNALS

BACKGROUND OF THE INVENTION

The present invention relates to a stereo amplifier circuit suitably used with stereo headphones, wherein the amplified stereo signals of the left and right channels appear at three output terminals and the output power is prominently increased under a low rated power supply voltage.

A stereo amplifier circuit for amplifying bichannel stereo signals and supplying the amplified signals to a 3-input speaker apparatus, such as a stereo headphone, is widely used. In a conventional stereo amplifier circuit of this type, when the absolute value of power supply voltage applied to the amplifier circuit is $|Vcc|$, the L-channel and R-channel output voltages of the amplified signals are at most $\pm Vcc$ (peak) with respect to the ground potential (0 V). If large output voltages are required, the power supply voltage must be increased. However, since an amplifier circuit for a stereo headphone is generally embodied in battery-operated portable equipment, the power supply voltage is restricted by the number of batteries used therein and hence, a high output power is hardly obtained according to a conventional battery-operated stereo amplifier circuit provided for three output terminals.

As a typical approach to increase the output voltage of the L- and R-channels with a low power supply voltage, a BTL (balanced transformerless) circuit is conventionally known. According to the BTL circuit, when the absolute value of the power supply voltage is $|Vcc|$, the output voltage of nearly 2 Vcc (peak) can be obtained. However, in a stereo amplifier circuit using the BTL circuit arrangement, four output terminals are inevitably used. As a result, a conventional BTL type stereo amplifier circuit cannot be adapted to 3-input stereo headphones.

SUMMARY OF THE INVENTION

It is accordingly the object of the present invention to provide a stereo amplifier circuit in which large bichannel signal outputs can be obtained from three output terminals under a relatively low rated power supply voltage, so that the bichannel outputs can be properly applied to 3-terminal input stereo headphones.

To achieve the above object a stereo amplifier circuit of the invention includes a first amplifier circuit for amplifying two input signals (L, R) with given amplification factors (a, b) to provide a first output signal (aL−bR); a second amplifier circuit for amplifying the input signals (L, R) with other amplification factors (e, f) to provide a second output signal (fR−eL); and a third amplifier circuit for amplifying the input signals (L, R) with still other amplification factors (c, d) to provide a third output signal (cL+dR). When the first and second amplifier circuits are noninverting amplifiers, the third amplifier circuit is an inverting amplifier in order that the phase of one input signal component (aL) in the first output signal is opposite to the phase of one input signal component (cL) in the third output signal and the phase of the other input signal component (fR) in the second output signal is opposite to the phase of the other input signal component (dR) in the third output signal. The first, second and third output signals are supplied to first, second and third output terminals, respectively.

A first load responding to the first input signal (L) is coupled between the first and third output terminals so that the potential difference ((aL−bR)−(−cL−dR)) between the first and third output signals is applied to the first load. A second load responding to the second input signal (R) is coupled between the second and third output terminals so that the potential difference ((fR−eL)−(−cL−dR)) between the second and third output signals is applied to the second load. Since the third output signal contains the antiphase component (−cL) of the first input signal (L), the potential difference between the first and third output signals has a larger first input signal component (aL+cL) than that (aL) only in the first output signal (aL−bR). Since the third output signal contains the antiphase component (−dR) of the second input signal (R), the potential difference between the second and third output signals has a larger second input signal component (fR+dR) than that (fR) only in the second output signal (fR−eL). Accordingly, increased bichannel outputs can be obtained using only three output terminals.

BRIEF DESCRIPTION OF THE DRAWINGS

FIG. 1 shows a basic configuration of a stereo amplifier circuit according to the present invention;

FIG. 2 illustrates an example of potential changes at three output terminals of the amplifier circuit shown in FIG. 1;

FIG. 3 shows a detailed block configuration of the circuit of FIG. 1;

FIG. 4 shows another block configuration of the circuit of FIG. 1;

DETAILED DESCRIPTION OF THE PREFERRED EMBODIMENTS

Figure 5:
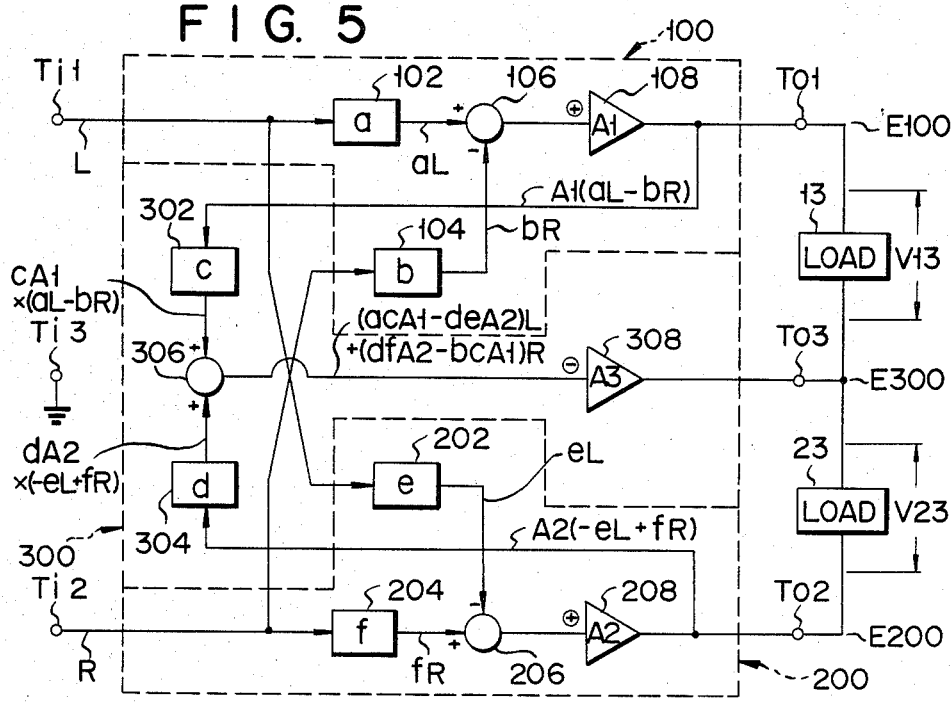
FIG. 5 shows another block configuration of the circuit of FIG. 1.

The embodiment of the present invention will be described with reference to the accompanying drawings.

In FIG. 1, reference symbols Ti1 to Ti3 denote input terminals of a stereo amplifier circuit 1. Among these input terminals, terminal Ti3 is circuit-grounded. An L channel input signal L is supplied across input terminals Ti1 and Ti3. An R channel input signal R is supplied across input terminals Ti2 and Ti3.

Input terminal Ti1 is connected to each one input terminal of first, second and third amplifier circuits 100, 200 and 300 which jointly constitute the stereo amplifier circuit 1. Input terminal Ti2 is connected to the other input terminal of each of first to third amplifier circuits 100, 200 and 300. First amplifier circuit 100 has such a matrix that the signal L is amplified by a factor a and the signal R by a factor b. A sum of these amplified signals $(aL+bR)$ is obtained as a first output signal E100 from a first output terminal To1 of the circuit 100. Similarly, second amplifier circuit 200 has such a matrix that the signal R is amplified by a factor f and the signal L by a factor e. A sum of these amplified signals $(fR+eL)$ is obtained as a second output signal E200 from a second output terminal To2 of the circuit 200. Third amplifier circuit 300 has such a matrix that the signal L is amplified by a factor c and the signal R by a factor d. A sum of these amplified signals $(cL+dR)$ is obtained as a third output signal E300 from a third output terminal To3 of the circuit 100.

When voltage potentials appearing at output terminals To1 to To3 are respectively represented by V1 to V3, these potentials are given as follows:

$$V1 = aL + bR \\ V2 = eL + fR \\ V3 = cL + dR \quad \text{or} \quad \begin{pmatrix} V1 \\ V2 \\ V3 \end{pmatrix} = \begin{pmatrix} a & b \\ e & f \\ c & d \end{pmatrix} \begin{pmatrix} L \\ R \end{pmatrix} \quad (1)$$

A potential difference V13 between output terminals To1 and To3 is thus given as follows:

$$V13 = V1 - V3 = aL + bR - (cL + dR) \\ = (a-c)L + (b-d)R \quad (2)$$

Similarly, a potential difference V23 between output terminals To2 and To3 is given as follows:

$$V23 = V2 - V3 = eL + fR - (cL + dR) \\ = (e-c)L + (f-d)R \quad (3)$$

Eqs. (2) and (3) may be represented as:

$$\begin{pmatrix} V13 \\ V23 \end{pmatrix} = \begin{pmatrix} (a-c) & (b-d) \\ (e-c) & (f-d) \end{pmatrix} \begin{pmatrix} L \\ R \end{pmatrix} \quad (3A)$$

When only the L channel signal component should be obtained between output terminals To1 and To3 and only the R channel signal component should be obtained between output terminals To2 and To3, the factors a to f must be set to satisfy the following conditions:

$$\left. \begin{array}{l} a - c \neq 0 \\ b - d = 0 \\ e - c = 0 \\ f - d \neq 0 \end{array} \right\} \quad (4)$$

For example, factors a to f may be given as follows:

$$a=\tfrac{3}{4},\ b=-\tfrac{1}{4},\ c=-\tfrac{1}{4},\ d=-\tfrac{1}{4},\ e=-\tfrac{1}{4},\ \text{and}\ f=\tfrac{3}{4} \quad (5)$$

In this case, potential difference V13 is:

$$V13 = V1 - V3 \\ = 3L/4 - R/4 - (-L/4 - R/4) \\ = L \quad (6)$$

Similarly, potential difference V23 is:

$$V23 = V2 - V3 \\ = -L/4 + 3R/4 - (-L/4 - R/4) \\ = R \quad (7)$$

In this manner, independent L and R channel outputs can be obtained from three output terminals To1 to To3.

In this case, the L channel output V13 and R channel output V23 are obtained as potential differences between waveforms V1 and V3 and between waveforms V2 and V3, respectively, as shown in FIG. 2. When the absolute value of power supply voltage applied to first to third amplifier circuits 100 to 300 is given as |Vcc|, the maximum peak value of each of outputs V13 and V23 becomes 2 Vcc as in the case of a conventional BTL circuit.

Namely, when factors a to f of first to third amplifier circuits 100 to 300 are properly selected, output voltages of L and R channels can be made higher than the rated power supply voltage Vcc with only three output terminals. Incidentally, when factors c and d of third amplifier circuit 300 are selected to be both zero, output terminal To3 becomes equivalent to a ground terminal, resulting in losing the increased output voltage over Vcc. Therefore, the factors c and d should not be both zero.

When some portions of the R and L channel signals are respectively mixed at given ratios in the L and R channel outputs V13 and V23, excluding the case wherein $b-d=0$ and $e-c=0$, a stereo wide effect can be obtained. For example, assume that factors a to f are given as follows:

$$a=\tfrac{3}{4},\ b=-\tfrac{1}{4},\ c=-(\tfrac{1}{4}-1/10),\ d=-(\tfrac{1}{4}-1/10), \\ e=-\tfrac{1}{4}\ \text{and}\ f=\tfrac{3}{4} \quad (8)$$

Then, potential difference V13 is:

$$V13 = V1 - V3 \quad (9)$$
$$= 3L/4 - R/4 - \{-1/4 - 1/10)L$$
$$\quad -(1/4 - 1/10)R\}$$
$$= 3L/4 - R/4 + L/4 - L/10 + R/4 - R/10$$
$$= 9L/10 - R/10$$

Similarly, potential difference V23 is given as follows:

$$V23 = V2 - V3 \quad (10)$$
$$= -L/4 + 3R/4 - \{-(1/4 - 1/10)L$$
$$\quad -(1/4 - 1/10)R\}$$
$$= -L/4 + 3R/4 + L/4 - L/10 + R/4 - R/10$$
$$= 9R/10 - L/10$$

Thus, the stereo wide effect can be obtained.

FIG. 3 shows a detailed block configuration of the stereo amplifier circuit of FIG. 1. Input signal L at input terminal Ti1 is supplied to a coefficient multiplier 102 having a factor a, to a coefficient multiplier 302 having a factor c and to a coefficient multiplier 202 having a factor e. Input signal R at input terminal Ti2 is supplied to a coefficient multiplier 204 having a factor f, to a coefficient multiplier 304 having a factor d and to a coefficient multiplier 104 having a factor b.

An output aL from multiplier 102 is supplied to the positive input of a subtracter 106. An output bR from multiplier 104 is supplied to the negative input of subtracter 106. An output aL−bR from subtracter 106 is supplied to a noninverting amplifier 108 having an amplification factor A1. Amplifier 108 supplies to output terminal To1 the first output signal E100 corresponding to A1(aL−bR). The elements 102 to 108 constitute the first amplifier circuit 100.

An output fR from multiplier 204 is supplied to the positive input of a subtracter 206. An output eL from multiplier 202 is supplied to the negative input of subtracter 206. An output −eL+fR from subtracter 206 is supplied to a noninverting amplifier 208 having an amplification factor A2. Amplifier 208 supplies to output terminal To2 the second output signal E200 corresponding to A2(−eL+fR). The elements 202 to 208 constitute the second amplifier circuit 200.

An output cL from multiplier 302 is supplied to one input of an adder 306. An output dR from multiplier 304 is supplied to the other input of adder 306. An output cL+dR from adder 306 is supplied to an inverting amplifier 308 having an amplification factor −A3. Amplifier 308 supplies to output terminal To3 the third output signal E300 corresponding to −A3(cL+dR). The elements 302 to 308 constitute the third amplifier circuit 300.

An L channel load 13 (e.g., L channel driver unit of a headphone) is connected between the output terminals To1 and To3, and an R channel load 23 (e.g., R channel driver unit of the headphone) is connected between the output terminals To2 and To3.

According to the configuration of FIG. 3, output potentials V1, V2 and V3 at terminals To1, To2 and To3 are:

$$\begin{pmatrix} V1 \\ V2 \\ V3 \end{pmatrix} = \begin{pmatrix} aA1 & -bA1 \\ -eA2 & fA2 \\ -cA3 & -dA3 \end{pmatrix} \begin{pmatrix} L \\ R \end{pmatrix} \quad (11)$$

Further, potential difference V13 between terminals To1 and To3 and potential difference V23 between terminals To2 and To3 are:

$$\begin{pmatrix} V13 \\ V23 \end{pmatrix} = \begin{pmatrix} (cA3 + aA1) & (dA3 - bA1) \\ (cA3 - eA2) & (dA3 + fA2) \end{pmatrix} \begin{pmatrix} L \\ R \end{pmatrix} \quad (12)$$

FIG. 4 shows another (alternative) block configuration of the stereo amplifier circuit of FIG. 1. Input signal L at input terminal Ti1 is supplied to coefficient multiplier 102 having factor a and to coefficient multiplier 202 having factor e. Input signal R at input terminal Ti2 is supplied to coefficient multiplier 204 having factor f and to coefficient multiplier 104 having factor b.

An output aL from multiplier 102 is supplied to the positive input of subtracter 106. An output bR from multiplier 104 is supplied to the negative input of subtracter 106. An output aL−bR from subtracter 106 is supplied to noninverting amplifier 108 having amplification factor A1. Amplifier 108 supplies to output terminal To1 the first output signal E100 corresponding to A1(aL−bR). The elements 102 to 108 constitute the first amplifier circuit 100.

An output fR from multiplier 204 is supplied to the positive input of subtracter 206. An output eL from multiplier 202 is supplied to the negative input of subtracter 206. An output −eL+fR from subtracter 206 is supplied to noninverting amplifier 208 having amplification factor A2. Amplifier 208 supplies to output terminal To2 the second output signal E200 corresponding to A2(−eL+fR). The elements 202 to 208 constitute the second amplifier circuit 200.

Output aL−bR from subtracter 106 is supplied to coefficient multiplier 302 having factor c. Output −eL+fR from subtracter 206 is supplied to coefficient multiplier 304 having factor d. An output acL−bcR from multiplier 302 is supplied to one input of adder 306. An output −deL+dfR from multiplier 304 is supplied to the other input of adder 306. An output (ac−de)L+(df−bc)R from adder 306 is supplied to inverting amplifier 308 having amplification factor −A3. Amplifier 308 supplies to output terminal To3 the third output signal E300 corresponding to −A3((ac−de)L+(df−bc)R). The elements 302 to 308 constitute the third amplifier circuit 300.

L channel load 13 is connected between the output terminals To1 and To3 and R channel load 23 is connected between the output terminals To2 and To3.

According to the configuration of FIG. 4, output potentials V1, V2 and V3 at terminals To1, To2 and To3 are:

$$\begin{pmatrix} V1 \\ V2 \\ V3 \end{pmatrix} = \begin{pmatrix} aA1 & -bA1 \\ -eA2 & fA2 \\ -(ac-de)A3 & -(df-bc)A3 \end{pmatrix} \begin{pmatrix} L \\ R \end{pmatrix} \quad (13)$$

Further, potential difference V13 between terminals To1 and To3 and potential difference V23 between terminals To2 and To3 are:

$$\begin{pmatrix} V13 \\ V23 \end{pmatrix} = \quad (14)$$

$$\begin{pmatrix} ((ac-de)A3 + aA1) & ((df-bc)A3 - bA1) \\ ((ac-de)A3 - eA2) & ((df-bc)A3 + fA2) \end{pmatrix} \begin{pmatrix} L \\ R \end{pmatrix}$$

FIG. 5 shows another (alternative) block configuration of the stereo amplifier circuit of FIG. 1. Input signal L is supplied to coefficient multiplier 102 having factor a and to coefficient multiplier 202 having factor e. Input signal R is supplied to coefficient multiplier 204 having factor f and to coefficient multiplier 104 having factor b.

An output aL from multiplier 102 is supplied to the positive input of subtracter 106. An output bR from multiplier 104 is supplied to the negative input of subtracter 106. An output aL−bR from subtracter 106 is supplied to noninverting amplifier 108 having amplification factor A1. Amplifier 108 supplies to output terminal To1 the first output signal E100 corresponding to A1(aL−bR). The elements 102 to 108 constitute the first amplifier circuit 100.

An output fR from multiplier 204 is supplied to the positive input of subtracter 206. An output eL from multiplier 202 is supplied to the negative input of subtracter 206. An output −eL+fR from subtracter 206 is supplied to noninverting amplifier 208 having amplification factor A2. Amplifier 208 supplies to output terminal To2 the second output signal E200 corresponding to A2(−eL+fR). The elements 202 to 208 constitute the second amplifier circuit 200.

Signal E100 from amplifier 108 corresponding to A1(aL−bR) is supplied to coefficient multiplier 302 having factor c. Signal E200 from amplifier 208 corresponding to A2(−eL+fR) is supplied to coefficient multiplier 304 having factor d. An output cA1(aL−bR) from multiplier 302 is supplied to one input of adder 306. An output dA2(−eL+fR) from multiplier 304 is supplied to the other input of adder 306. An output (acA1−deA2)L+(dfA2−bcA1)R from adder 306 is supplied to inverting amplifier 308 having amplification factor −A3. Amplifier 308 supplies to output terminal To3 the third output signal E300 corresponding to −A3((acA1−deA2)L+(dfA2−bcA1)R). The elements 302 to 308 constitute the third amplifier circuit 300.

L channel load 13 is connected between the output terminals To1 and To3 and R channel load 23 is connected between the output terminals To2 and To3.

According to the configuration of FIG. 5, output potentials V1, V2 and V3 at terminals To1, To2 and To3 are:

$$\begin{pmatrix} V1 \\ V2 \\ V3 \end{pmatrix} = \begin{pmatrix} aA1 & -bA1 \\ -eA2 & fA2 \\ -(acA1 - deA2)A3 & -(dfA2 - bcA1)A3 \end{pmatrix} \begin{pmatrix} L \\ R \end{pmatrix} \quad (15)$$

Further, potential difference V13 between terminals To1 and To3 and potential difference V23 between terminals To2 and To3 are:

$$\begin{pmatrix} V13 \\ V23 \end{pmatrix} = \qquad (16)$$

$$\begin{pmatrix} ((acA1 - deA2)A3 + aA1) & ((dfA2 - bcA1)A3 - bA1) \\ ((acA1 - deA2)A3 - eA2) & ((dfA2 - bcA1)A3 + fA2) \end{pmatrix} \begin{pmatrix} L \\ R \end{pmatrix}$$

Figure 6:
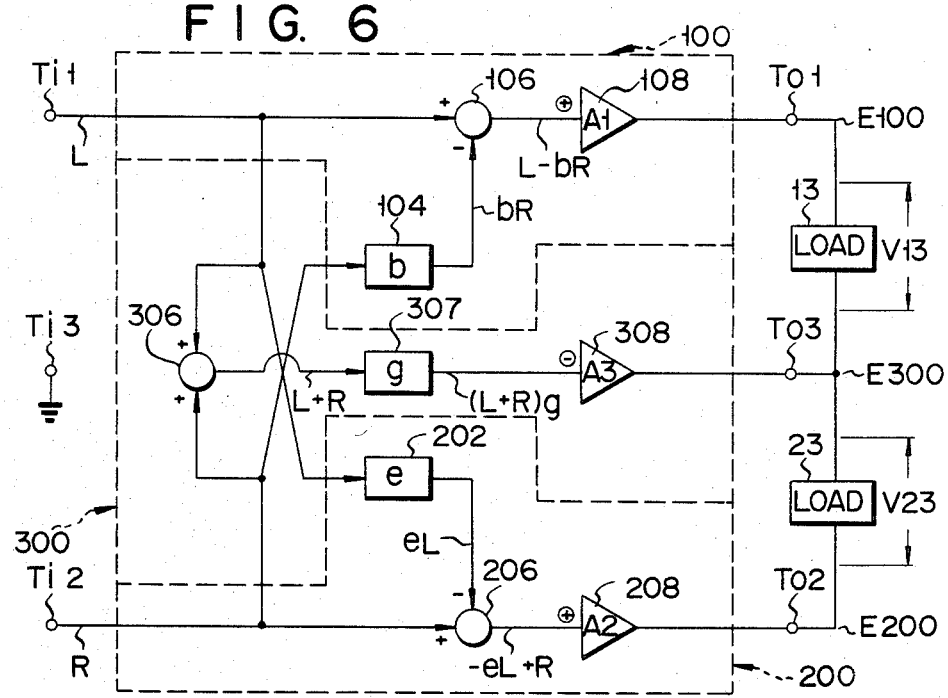
FIG. 6 shows another block configuration of the circuit of FIG. 1.

FIG. 6 shows another (alternative) block configuration of the stereo amplifier circuit of FIG. 1. Input signal L is supplied to coefficient multiplier 202 having factor e. Input signal R is supplied to coefficient multiplier 104 having factor b.

Signal L is also supplied to the positive input of subtracter 106. An output bR from multiplier 104 is supplied to the negative input of subtracter 106. An output L−bR from subtracter 106 is supplied to noninverting amplifier 108 having amplification factor A1. Amplifier 108 supplies to output terminal To1 the first output signal E100 corresponding to A1(L−bR). The elements 102 to 108 constitute the first amplifier circuit 100.

Signal R is also supplied to the positive input of subtracter 206. An output eL from multiplier 202 is supplied to the negative input of subtracter 206. An output −eL+R from subtracter 206 is supplied to noninverting amplifier 208 having amplification factor A2. Amplifier 208 supplies to output terminal To2 the second output signal E200 corresponding to A2(−eL+R). The elements 202 to 208 constitute the second amplifier circuit 200.

Signals L and R are supplied to the inputs of adder 306. An output L+R from adder 306 is supplied to a coefficient multiplier 307 having a factor g. An output (L+R)g from multiplier 307 is supplied to inverting amplifier 308 having amplification factor −A3. Amplifier 308 supplies to output terminal To3 the third output signal E300 corresponding to −gA3(L+R). The elements 302 to 308 constitute the third amplifier circuit 300.

L channel load 13 is connected between the output terminals To1 and To3 and R channel load 23 is connected between the output terminals To2 and To3.

According to the configuration of FIG. 6, output potentials V1, V2 and V3 at terminals To1, To2 and To3 are:

$$\begin{pmatrix} V1 \\ V2 \\ V3 \end{pmatrix} = \begin{pmatrix} A1 & -bA1 \\ -eA2 & A2 \\ -gA3 & -gA3 \end{pmatrix} \begin{pmatrix} L \\ R \end{pmatrix} \quad (17)$$

Further, potential difference V13 between terminals To1 and To3 and potential difference V23 between terminals To2 and To3 are:

$$\begin{pmatrix} V13 \\ V23 \end{pmatrix} = \begin{pmatrix} (gA3 + A1) & (gA3 - bA1) \\ (gA3 - eA2) & (gA3 + A2) \end{pmatrix} \begin{pmatrix} L \\ R \end{pmatrix} \quad (18)$$

Figure 7:
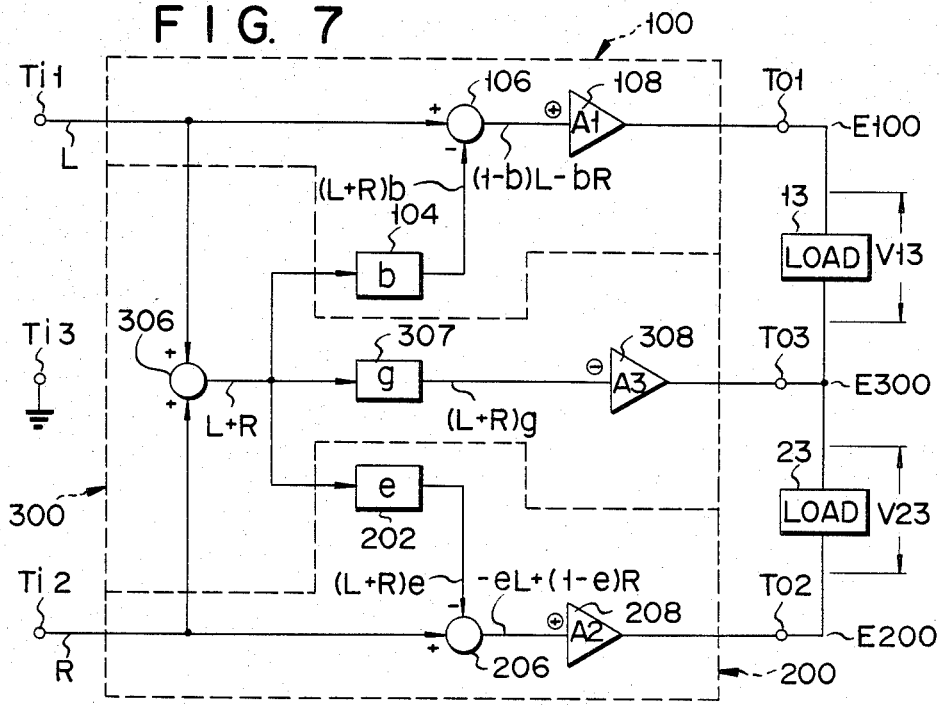
FIG. 7 shows another block configuration of the circuit of FIG. 1.

FIG. 7 shows another (alternative) block configuration of the stereo amplifier circuit of FIG. 1. Input signal L is supplied to the positive input of subtracter 106 and to one input of adder 306. Input signal R is supplied to the positive input of subtracter 206 and to the other input of adder 306. An output L+R from adder 306 is supplied to coefficient multiplier 104 having factor b, to coefficient multiplier 202 having factor e and to coefficient multiplier 307 having factor g.

An output (L+R)b from multiplier 104 is supplied to the negative input of subtracter 106. An output (1−b)L−bR from subtracter 106 is supplied to noninverting amplifier 108 having amplification factor A1. Amplifier 108 supplies to output terminal To1 the first output signal E100 corresponding to A1((1−b)L−bR). The elements 104 to 108 constitute the first amplifier circuit 100.

An output (L+R)e from multiplier 202 is supplied to the negative input of subtracter 206. An output −eL+(1−e)R from subtracter 206 is supplied to noninverting amplifier 208 having amplification factor A2. Amplifier 208 supplies to output terminal To2 the second output signal E200 corresponding to A2(−eL+(1−e)R). The elements 202 to 208 constitute the second amplifier circuit 200.

An output (L+R)g from multiplier 307 is supplied to inverting amplifier 308 having amplification factor −A3. Amplifier 308 supplies to output terminal To3 the third output signal E300 corresponding to −gA3(L+R). The elements 306 to 308 constitute the third amplifier circuit 300.

L channel load 13 is connected between the output terminals To1 and To3 and R channel load 23 is connected between the output terminals To2 and To3.

According to the configuration of FIG. 7, output potentials V1, V2 and V3 at terminals To1, To2 and To3 are:

$$\begin{pmatrix} V1 \\ V2 \\ V3 \end{pmatrix} = \begin{pmatrix} (1-b)A1 & -bA1 \\ -eA2 & (1-e)A2 \\ -gA3 & -gA3 \end{pmatrix} \begin{pmatrix} L \\ R \end{pmatrix} \quad (19)$$

Further, potential difference V13 between terminals To1 and To3 and potential difference V23 between terminals To2 and To3 are:

$$\begin{pmatrix} V13 \\ V23 \end{pmatrix} = \begin{pmatrix} (gA3 + (1-b)A1) & (gA3 - bA1) \\ (gA3 - eA2) & (gA3 + (1-e)A2) \end{pmatrix} \begin{pmatrix} L \\ R \end{pmatrix} \quad (20)$$

Figure 8:
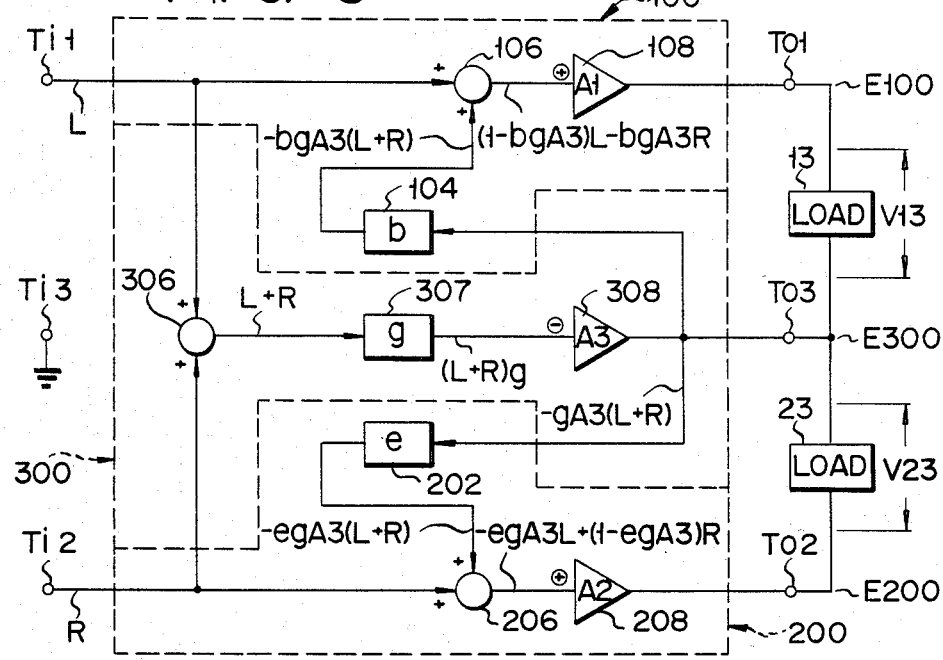
FIG. 8 shows another block configuration of the circuit of FIG. 1.

FIG. 8 shows another (alternative) block configuration of the stereo amplifier circuit of FIG. 1. Input signal L is supplied to one input of adder 106 and to one input of adder 306. Input signal R is supplied to one input of adder 206 and to the other input of adder 306. An output L+R from adder 306 is supplied to coefficient multiplier 307 having factor g.

An output (L+R)g from multiplier 307 is supplied to inverting amplifier 308 having amplification factor −A3. Amplifier 308 supplies to output terminal To3 the third output signal E300 corresponding to −gA3(L+R). The elements 306 to 308 constitute the third amplifier circuit 300.

Signal E300 is supplied to coefficient multipliers 104 and 202. An output −bgA3(L+R) from multiplier 104 is supplied to the other input of adder 106. An output (1−bgA3)L−bgA3R from adder 106 is supplied to noninverting amplifier 108 having amplification factor A1. Amplifier 108 supplies to output terminal To1 the first output signal E100 corresponding to A1((1−bgA3)L−bgA3R). The elements 104 to 108 constitute the first amplifier circuit 100.

An output −egA3(L+R) from multiplier 202 is supplied to the other input of adder 206. An output −egA3L+(1−egA3)R from adder 206 is supplied to noninverting amplifier 208 having amplification factor A2. Amplifier 208 supplies to output terminal To2 the second output signal E200 corresponding to A2(−egA3L+(1−egA3)R). The elements 202 to 208 constitute the second amplifier circuit 200.

L channel load 13 is connected between the output terminals To1 and To3 and R channel load 23 is connected between the output terminals To2 and To3.

According to the configuration of FIG. 8, output potentials V1, V2 and V3 at terminals To1, To2 and To3 are:

$$\begin{pmatrix} V1 \\ V2 \\ V3 \end{pmatrix} = \begin{pmatrix} (1-bgA3)A1 & -bgA3A1 \\ -egA3A2 & (1-egA3)A2 \\ -gA3 & -gA3 \end{pmatrix} \begin{pmatrix} L \\ R \end{pmatrix} \quad (21)$$

Further, potential difference V13 between terminals To1 and To3 and potential difference V23 between terminals To2 and To3 are:

$$\begin{pmatrix} V13 \\ V23 \end{pmatrix} = \begin{pmatrix} (gA3 + (1-bgA3)A1) & (gA3 - bgA3A1) \\ (gA3 - egA3A2) & (gA3 + (1-egA3)A2) \end{pmatrix} \begin{pmatrix} L \\ R \end{pmatrix} \quad (22)$$

Figure 9:
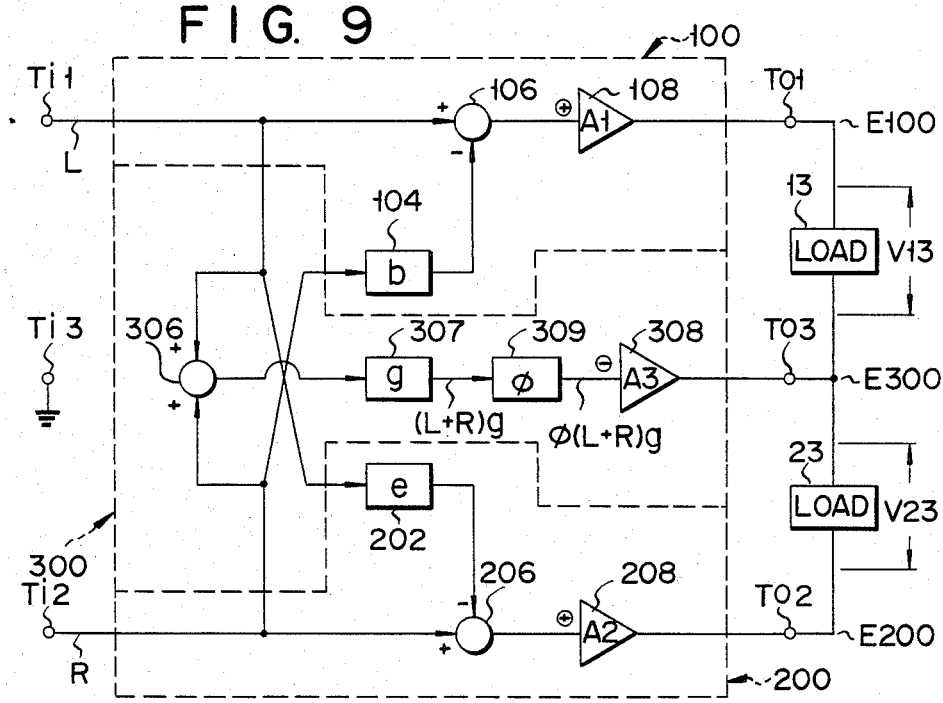
FIG. 9 shows another block configuration of the circuit of FIG. 1.

FIG. 9 shows another (alternative) block configuration of the stereo amplifier circuit of FIG. 1. FIG. 9 may be regarded as a modification of FIG. 6. Description will therefore be given only to the difference between FIG. 6 and FIG. 9.

An output (L+R)g from coefficient multiplier 307 is supplied to a phase shifter 309. Phase shifter 309 advances or delays the phase of the inputted signal by about 60 to 120 degrees (preferably 90 degrees) around 250 Hz to 4 kHz. A phase-shifted output $\phi$(L+R)g from phase shifter 309 is supplied to inverting amplifier 308 having amplification factor −A3. Amplifier 308 supplies to output terminal To3 the third output signal E300 corresponding to −$\phi$gA3(L+R). The elements 306 to 309 constitute the third amplifier circuit 300.

According to the configuration of FIG. 9, output potentials V1, V2 and V3 at terminals To1, To2 and To3 are:

$$\begin{pmatrix} V1 \\ V2 \\ V3 \end{pmatrix} = \begin{pmatrix} A1 & -bA1 \\ -eA2 & A2 \\ -\phi gA3 & -\phi gA3 \end{pmatrix} \begin{pmatrix} L \\ R \end{pmatrix} \quad (23)$$

Further, potential difference V13 between terminals To1 and To3 and potential difference V23 between terminals To2 and To3 are:

$$\begin{pmatrix} V13 \\ V23 \end{pmatrix} = \begin{pmatrix} (\phi gA3 + A1) & (\phi gA3 - bA1) \\ (\phi gA3 - eA2) & (\phi gA3 + A2) \end{pmatrix} \begin{pmatrix} L \\ R \end{pmatrix} \quad (24)$$

Figure 10:
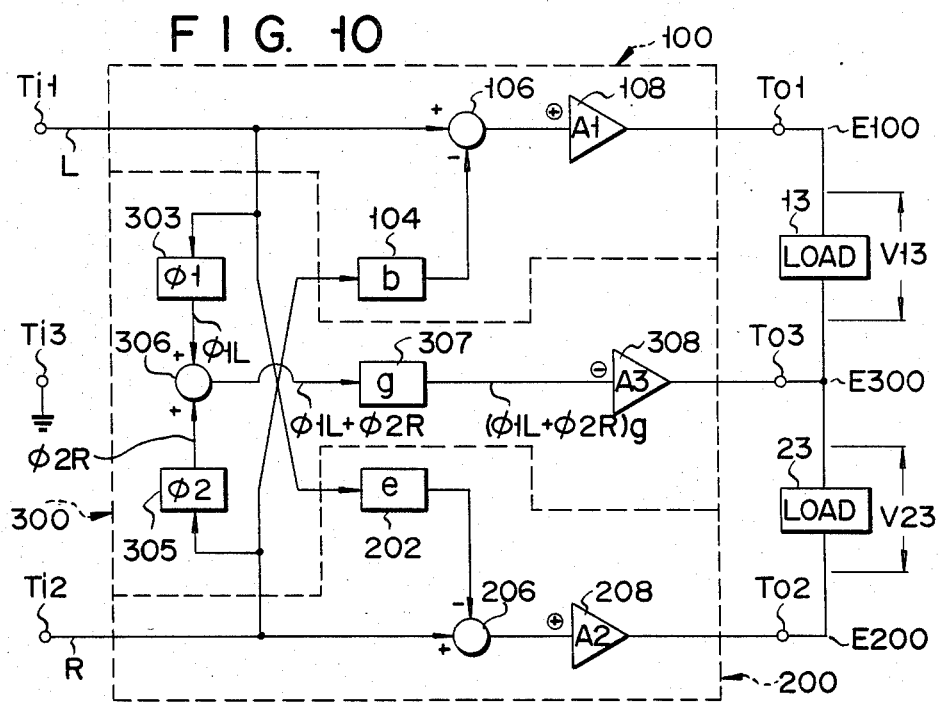
FIG. 10 shows another block configuration of the circuit of FIG. 1.

FIG. 10 shows another (alternative) block configuration of the stereo amplifier circuit of FIG. 1. FIG. 10 may be regarded as a modification of FIG. 9. Description will therefore be given only to the difference between FIG. 9 and FIG. 10.

Input signal L is supplied to a first phase shifter 303 and input signal R is supplied to a second phase shifter 305. Phase shifter 303 delays (or advances) the phase of signal L by, e.g., about 45 degrees around 1 kHz and phase shifter 305 delays (or advances) the phase of signal R by, e.g., about 135 degrees around 1 kHz. A phase shifted output $\phi$1L from phase shifter 303 is supplied to one input of adder 306 and a phase shifted output $\phi$2R from phase shifter 305 is supplied to the other input of adder 306. An output $\phi$1L+$\phi$2R from adder is supplied to coefficient multiplier 307. An output ($\phi$1L+$\phi$2R)g from coefficient multiplier 307 is supplied to inverting amplifier 308 having amplification factor −A3. Amplifier 308 supplies to output terminal To3 the third output signal E300 corresponding to −gA3($\phi$1L+$\phi$2R). The elements 303 to 308 constitute the third amplifier circuit 300.

According to the configuration of FIG. 10, output potentials V1, V2 and V3 at terminals To1, To2 and To3 are:

$$\begin{pmatrix} V1 \\ V2 \\ V3 \end{pmatrix} = \begin{pmatrix} A1 & -bA1 \\ -eA2 & A2 \\ -\phi1gA3 & -\phi2gA3 \end{pmatrix} \begin{pmatrix} L \\ R \end{pmatrix} \quad (25)$$

Further, potential difference V13 between terminals To1 and To3 and potential difference V23 between terminals To2 and To3 are:

$$\begin{pmatrix} V13 \\ V23 \end{pmatrix} = \begin{pmatrix} (\phi1gA3 + A1) & (\phi2gA3 - bA1) \\ (\phi1gA3 - eA2) & (\phi2gA3 + A2) \end{pmatrix} \begin{pmatrix} L \\ R \end{pmatrix} \quad (26)$$

Figure 11:
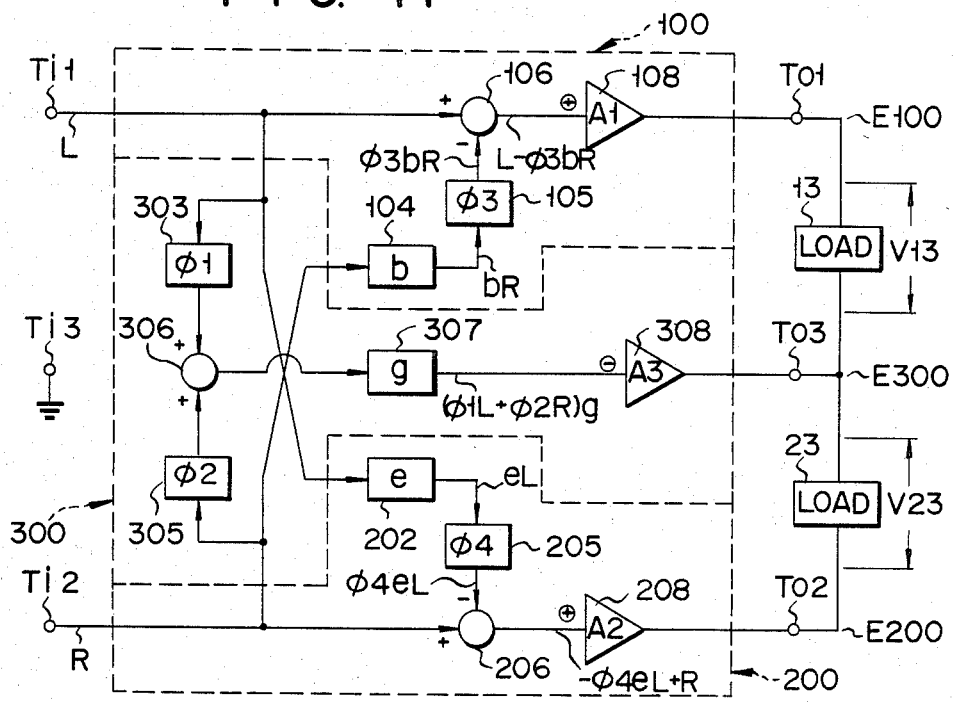
FIG. 11 shows another block configuration of the circuit of FIG. 1.

FIG. 11 shows another (alternative) block configuration of the stereo amplifier circuit of FIG. 1. FIG. 11 may be regarded as a modification of FIG. 10. Description will therefore be given only to the difference between FIG. 10 and FIG. 11.

Input signal L is supplied to coefficient multiplier 202 and input signal R is supplied to coefficient multiplier 104. An output bR from multiplier 104 is supplied to a third phase shifter 105. An output $\phi$3bR from phase shifter 105 is supplied to the negative input of subtracter 106. An output L−$\phi$3bR from subtracter 106 is supplied to noninverting amplifier 108 having amplification factor A1. Amplifier 108 supplies to output terminal To1 the first output signal E100 corresponding to A1(L−$\phi$3bR). The elements 104 to 108 constitute the first amplifier circuit 100.

An output eL from multiplier 202 is supplied to a fourth phase shifter 205. An output $\phi$4eL from phase shifter 205 is supplied to the negative input of subtracter 206. An output −$\phi$4eL+R from subtracter 206 is supplied to noninverting amplifier 208 having amplification factor A2. Amplifier 208 supplies to output terminal To2 the second output signal E200 corresponding to A2(−$\phi$4eL+R). The elements 202 to 208 constitute the second amplifier circuit 200.

According to the configuration of FIG. 11, output potentials V1, V2 and V3 at terminals To1, To2 and To3 are:

$$\begin{pmatrix} V1 \\ V2 \\ V3 \end{pmatrix} = \begin{pmatrix} A1 & -\phi3bA1 \\ -\phi4eA2 & A2 \\ -\phi1gA3 & -\phi2gA3 \end{pmatrix} \begin{pmatrix} L \\ R \end{pmatrix} \quad (27)$$

Further, potential difference V13 between terminals To1 and To3 and potential difference V23 between terminals To2 and To3 are:

$$\begin{pmatrix} V13 \\ V23 \end{pmatrix} = \begin{pmatrix} (\phi1gA3 + A1) & (\phi2gA3 - \phi3bA1) \\ (\phi1gA3 - \phi4eA2) & (\phi2gA3 + A2) \end{pmatrix} \begin{pmatrix} L \\ R \end{pmatrix} \quad (28)$$

Figure 12:
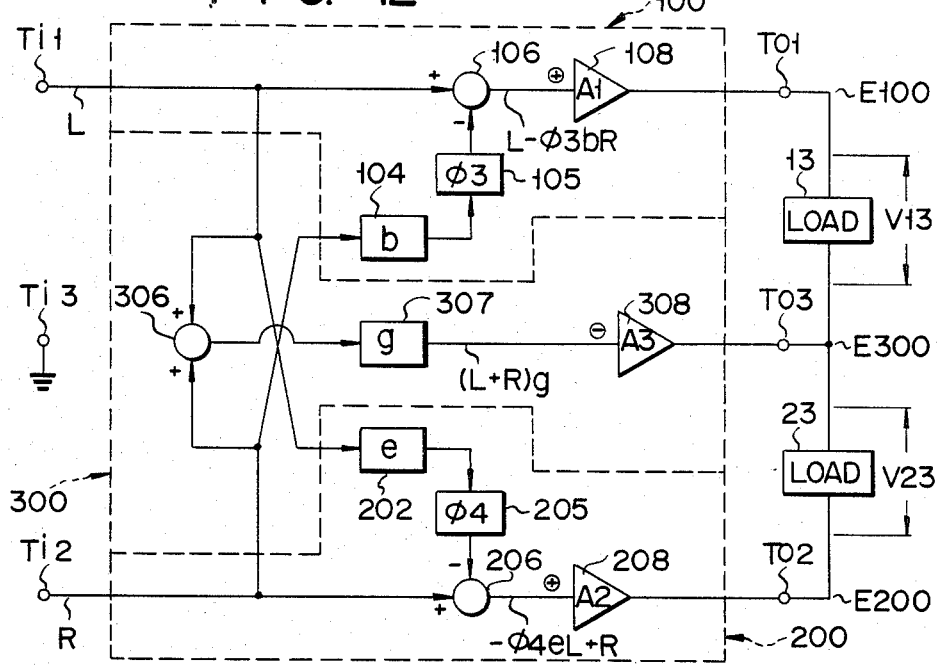
FIG. 12 shows another block configuration of the circuit of FIG. 1.

FIG. 12 shows another (alternative) block configuration of the stereo amplifier circuit of FIG. 1. FIG. 12 may be regarded as a modification of FIG. 11. Description will therefore be given only to the difference between FIG. 11 and FIG. 12.

Input signals L and R are supplied to adder 306. An output L+R from adder 306 is supplied to coefficient multiplier 307. An output (L+R)g from coefficient multiplier 307 is supplied to inverting amplifier 308 having amplification factor −A3. Amplifier 308 supplies to output terminal To3 the third output signal E300 corresponding to −gA3(L+R). The elements 306 to 308 constitute the third amplifier circuit 300.

According to the configuration of FIG. 12, output potentials V1, V2 and V3 at terminals To1, To2 and To3 are:

$$\begin{pmatrix} V1 \\ V2 \\ V3 \end{pmatrix} = \begin{pmatrix} A1 & -\phi3bA1 \\ -\phi4eA2 & A2 \\ -gA3 & -gA3 \end{pmatrix} \begin{pmatrix} L \\ R \end{pmatrix} \quad (29)$$

Further, potential difference V13 between terminals To1 and To3 and potential difference V23 between terminals To2 and To3 are:

$$\begin{pmatrix} V13 \\ V23 \end{pmatrix} = \begin{pmatrix} (gA3 + A1) & (gA3 - \phi3bA1) \\ (gA3 - \phi4eA2) & (gA3 + A2) \end{pmatrix} \begin{pmatrix} L \\ R \end{pmatrix} \quad (30)$$

According to the configuration of FIGS. 9 to 12, as may be seen from Eqs. (24), (26), (28) and (30), L channel output V13 and R channel output V23 contain phase-shifted signal components of any of $\phi$1 to $\phi$4. These phase-shifted signal components would provide a specific stereo sound effect.

Figure 13:
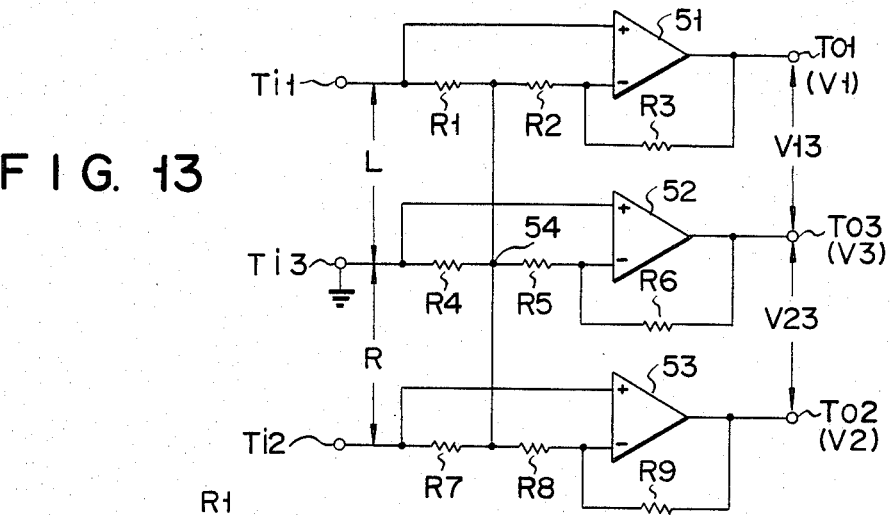
FIG. 13 shows a circuit diagram embodying the configuration of FIG. 1.

A detailed circuit arrangement of stereo amplifier circuit 1 of FIG. 1 will be described hereinafter. In FIG. 13, input terminal Ti1 is coupled to the noninverted input (+) of an OP amplifier 51 and to the inverted input (−) of amplifier 51 via a series circuit of resistors R1 and R2. The output of amplifier 51 is coupled to output terminal To1 and to the inverted input thereof via a resistor R3. Input terminal Ti2 is coupled to the noninverted input (+) of an OP amplifier 53 and to the inverted input (−) of amplifier 53 via a series circuit of resistors R7 and R8. The output of amplifier 53 is coupled to output terminal To2 and to the inverted input thereof via a resistor R9. Input terminal Ti3 which is circuit-grounded is coupled to the noninverted input (+) of an OP amplifier 52 and to the inverted input (−) of amplifier 52 via a series circuit of resistors R4 and R5. The output of amplifier 52 is coupled to output terminal To3 and to the inverted input thereof via a resistor R6. The connecting nodes between resistors R1 and R2, between resistors R4 and R5 and between resistors R7 and R8 are connected each other.

Figure 14:
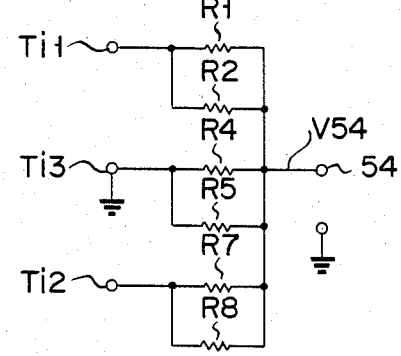
FIG. 14 shows an equivalent circuit of the resistor branch of FIG. 13.

Assume that gains of amplifiers 51 to 53 are quite large (e.g., 100 dB or more). Then, the respective potential differences between the inverted and noninverted inputs of amplifiers 51 to 53 become substantially zero. From this, when a resistor network having a common node 54 is considered, the circuit of FIG. 13 is equivalent to a resistor branch shown in FIG. 14. When two channel input signals L and R are applied across input terminals Ti1 and Ti3 and across input terminals Ti2 and Ti3, respectively, an output voltage V54 at common node 54 is given as follows:

$$V54 = [\{(R4//R5)//(R7//R8)\}/\{(R1//R2) \quad (31)$$
$$+ (R4//R5)//(R7//R8)\}]L$$
$$+ [\{(R1//R2)//(R4//R5)\}/\{(R7//R8)$$
$$+ (R1//R2)//(R4//R5)\}]R$$

When output voltages of amplifiers 51, 53 and 52 are defined as V1, V2 and V3, respectively, the following relation is given:

$$(V1-L)/R3=(L-V54)/R2 \quad (32)$$

Therefore, $$V1=\{(R2+R3)/R2\}L-(R3/R2)V54 \quad (33)$$

Similarly, $$(V2-R)/R9=(R-V54)/R8 \quad (34)$$

Therefore, $$V2=\{(R8+R9)/R8\}R-(R9/R8)V54 \quad (35)$$

Further, $$V3=-(R6/R5)V54 \quad (36)$$

From this, potential difference V13 between output terminals To1 and To3 is:

$$V13 = V1 - V3 \quad (37)$$
$$= \{(R2 + R3)/R2\}L + (R6/R5 - R3/R2)V54$$

Similarly, voltage difference V23 between output terminals To2 and To3 is:

$$V23 = V2 - V3 \quad (38)$$
$$= \{(R8 + R9)/R8\}R + (R6/R5 - R9/R8)V54$$

If the relation:

$$R3/R2=R6/R5=R9/R8 \quad (39)$$

holds, Eqs. (37) and (38) may be represented as:

$$V13 = \{(R2 + R3)/R2\}L \quad (40)$$

$$V23 = \{(R8 + R9)/R8\}R$$

or $$\begin{pmatrix} V13 \\ V23 \end{pmatrix} = \begin{pmatrix} (R2 + R3)/R2 & 0 \\ 0 & (R8 + R9)/R8 \end{pmatrix} \begin{pmatrix} L \\ R \end{pmatrix}$$

Thus, the L and R channel stereo outputs are obtained from three output terminals To1 to To3.

Figure 15:
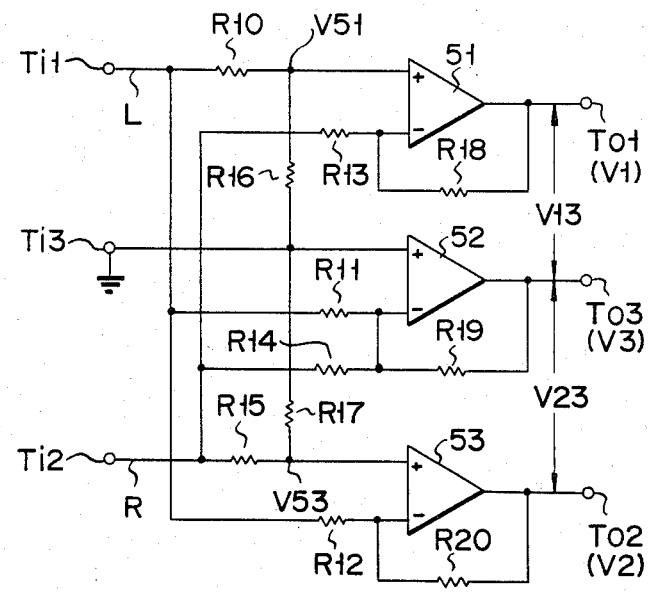
FIG. 15 shows another circuit diagram embodying the configuration of FIG. 1.

FIG. 15 shows another (alternative) detailed circuit arrangement of the circuit 1 in FIG. 1. In FIG. 15, input terminal Ti1 is coupled via a resistor R10 to the noninverted input of amplifier 51, via a resistor R11 to the inverted input of amplifier 52 and via a resistor R12 to the inverted input of amplifier 53. Input terminal Ti2 is coupled via a resistor R13 to the inverted input of amplifier 51, via a resistor R14 to the inverted input of amplifier 52 and via a resistor R15 to the non-inverted input of amplifier 53. Input terminal Ti3 which is circuit-grounded is coupled to the noninverted input of amplifier 52, and also to the noninverted inputs of amplifiers 51 and 53 via resistors R16 and R17, respectively. The output of amplifier 51 is coupled to output terminal To1 and via a resistor R18 to the inverted input thereof, the output of amplifier 52 is coupled to output terminal To3 and via a resistor R19 to the inverted input thereof and the output of amplifier 53 is coupled to output terminal To2 and via a resistor R20 to the inverted input thereof.

In the circuit shown in FIG. 15, when L and R channel signals are supplied to input terminals Ti1 and Ti2, a voltage V51 at the noninverted input of amplifier 51 is given as follows:

$$V51=\{R16/(R10+R16)\}L \quad (41)$$

When the output voltage of amplifier 51 is represented by V1, the following relation holds:

$$[\{R16/(R10+R16)\}L-V1]/R18=[R-\{R16/(R10+R16)\}L]/R13 \quad (42)$$

Therefore, $$V1=\{(R13+R18)/R13\}\{R16/(R10+R16)\}L-(R18/R13)R \quad (43)$$

Since the noninverted input of amplifier 52 is circuit-grounded, when the output voltage of amplifier 52 is represented by V3, the following relation holds:

$$-V3/R19=L/R11+R/R14 \quad (44)$$

Therefore, $$V3=-(R19/R11)L-(R19/R14)R \quad (45)$$

Furthermore, a voltage V53 at the noninverted input of amplifier 53 is given as follows:

$$V53=\{R17/(R15+R17)\}R \quad (46)$$

Then, when the output voltage of amplifier 53 is V2−, the following relation holds:

$$[\{R17/(R15+R17)\}R-V2]/R20=[L-\{R17/(R15+R17)\}R]/R12 \quad (47)$$

Therefore, $$V2=-(R20/R12)L+\{(R12+R20)/R12\}\times\{R17/(R15+R17)\}R \quad (48)$$

If the conditions:

$$\left.\begin{array}{l} R10 = R15 \\ R16 = R17 \\ R11 = R12 = R13 = R14 \\ R18 = R19 = R20 \end{array}\right\} \quad (49)$$

are established, potential difference V13 between output terminals To1 and To3 is given as follows:

$$V13 = V1 - V3 \quad (50)$$
$$= [\{(R13 + R18)/R13\}\{R16/(R10 + R16)\}L$$
$$-(R18/R13)R] - \{-(R19/R11)L$$
$$-(R19/R14)R\}$$
$$= [\{(R11 + R19)/R11\}\{R16/(R10 + R16)\}$$
$$+ R19/R11]L$$

Similarly, potential difference V23 between output terminals To2 and To3 is given below:

$$V23 = V2 - V3 \quad (51)$$
$$= [\{(R11 + R19)/R11\}\{R17/(R15 + R17)\} + R19/R11]R$$

Eqs. (50) and (51) may be represented as:

$$\begin{pmatrix} V13 \\ V23 \end{pmatrix} = \quad (52)$$

$$\begin{pmatrix} \{(R11 + R19)/R11\}\{R16/(R10 + R16)\} + R19/R11 & 0 \\ 0 & \{(R11 + R19)/R11\}\{R17/(R15 + R17)\} + R19/R11 \end{pmatrix} \begin{pmatrix} L \\ R \end{pmatrix}$$

Thus, the L and R channel output signals are obtained from three output terminals To1 to To3.

Figure 16:
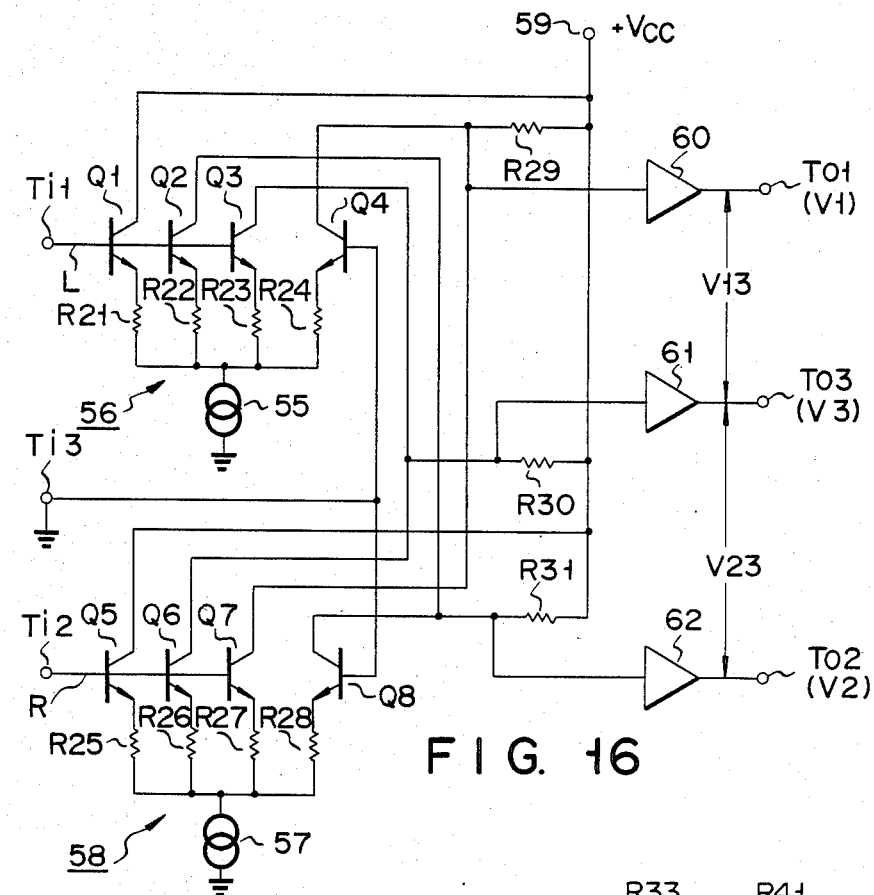
FIG. 16 shows another circuit diagram embodying the configuration of FIG. 1.

FIG. 16 shows another (alternative) detailed circuit arrangement of the circuit in FIG. 1. In FIG. 16, input terminal Ti1 is connected to the bases of npn transistors Q1 to Q3. The emitters of transistors Q1 to Q3 are coupled respectively via resistors R21 to R23 to one end of a constant current source 55 which is also coupled via a resistor R24 to the emitter of an npn transistor Q4. The other end of constant current source 55 is circuit-grounded. Transistors Q1 to Q4, resistors R21 to R24, and constant current source 55 constitute a first differential amplifier circuit 56.

Input terminal Ti2 is connected to the bases of npn transistors Q5 to Q7. The emitters of transistors Q5 to Q7 are coupled respectively via resistors R25 to R27 to one end of a constant current source 57 which is also coupled via a resistor R28 to the emitter of an npn transistor Q8. The other end of constant current source 57 is circuit-grounded. Transistors Q5 to Q8, resistors R25 to R28, and constant current source 57 constitute a second differential amplifier circuit 58.

The bases of transistors Q4 and Q8 are connected to input terminal Ti3 which is circuit-grounded. The collectors of transistors Q1 and Q5 are connected to a power supply terminal 59 to which a DC potential of +Vcc is applied. The collectors of transistors Q4 and Q7 are coupled via a resistor R29 to power supply terminal 59 and via a buffer circuit 60 to output terminal To1. The collectors of transistors Q3 and Q6 are coupled via a resistor R30 to power supply terminal 59 and via a buffer circuit 61 to output terminal To3. The collectors of transistors Q2 and Q8 are coupled via a resistor R31 to power supply terminal 59 and via a buffer circuit 62 to output terminal To2.

In order to cause differential amplifier circuits 56 and 58 to perform linear differential amplification, voltage drops across resistors R21 to R28 are selected to be far greater than a voltage VT of transistors Q1 to Q8, which is given by:

$$V_T = kT/q \quad (53)$$

where
k: Boltzmann's constant
T: the absolute temperature
q: the electron charge
and the following conditions are satisfied:

$$\begin{aligned} R24 &= R21//R22//R23 \\ R28 &= R25//R26//R27 \end{aligned} \quad (54)$$

In the circuit of FIG. 16, when the L and R channel signals are supplied to input terminals Ti1 and Ti2, respectively, output voltage V1 of buffer circuit 60 is given as:

$$\begin{aligned} V1 &= R29(\Delta Ic4 + \Delta Ic7) \\ &= R29(L/R24 - R/R27) \end{aligned} \quad (55)$$

where $\Delta Ic4$ and $\Delta Ic7$ are changes in collector currents of transistors Q4 and Q7.

Output voltage V3 of buffer circuit 61 is given as:

$$\begin{aligned} V3 &= R30(\Delta Ic3 + \Delta Ic6) \\ &= R30(-L/R23 - R/R26) \end{aligned} \quad (56)$$

where $\Delta Ic3$ and $\Delta Ic6$ are changes in collector currents of transistors Q3 and Q6.

Output voltage V2 of buffer circuit 62 is given as:

$$\begin{aligned} V2 &= R31(\Delta Ic2 + \Delta Ic8) \\ &= R31(-L/R22 + R/R28) \end{aligned} \quad (57)$$

where $\Delta Ic2$ and $\Delta Ic8$ are changes in collector currents of transistors Q2 and Q8.

If the following conditions are given:

$$\begin{aligned} R29 &= R30 = R31 \\ R24 &= R28 \\ R23 &= R27 = R22 = R26 \end{aligned} \quad (58)$$

then, potential difference V13 between output terminals To1 and To3 is given as follows:

$$\begin{aligned} V13 &= V1 - V3 \\ &= R29(L/R24 - R/R27) - R30(-L/R23 - R/R26) \\ &= R30(1/R24 + 1/R23)L \end{aligned} \quad (59)$$

Similarly, potential difference V23 between output terminals To2 and To3 is given as follows:

$$\begin{aligned} V23 &= V2 - V3 \\ &= R30(1/R24 + 1/R23)R \end{aligned} \quad (60)$$

Eqs. (59) and (60) may be represented as:

$$\begin{pmatrix} V13 \\ V23 \end{pmatrix} = \begin{pmatrix} R30(1/R24 + 1/R23) & 0 \\ 0 & R30(1/R24 + 1/R23) \end{pmatrix} \begin{pmatrix} L \\ R \end{pmatrix} \quad (61)$$

Thus, the L and R channel output signals are obtained from three output terminals To1 to To3.

Figure 17:
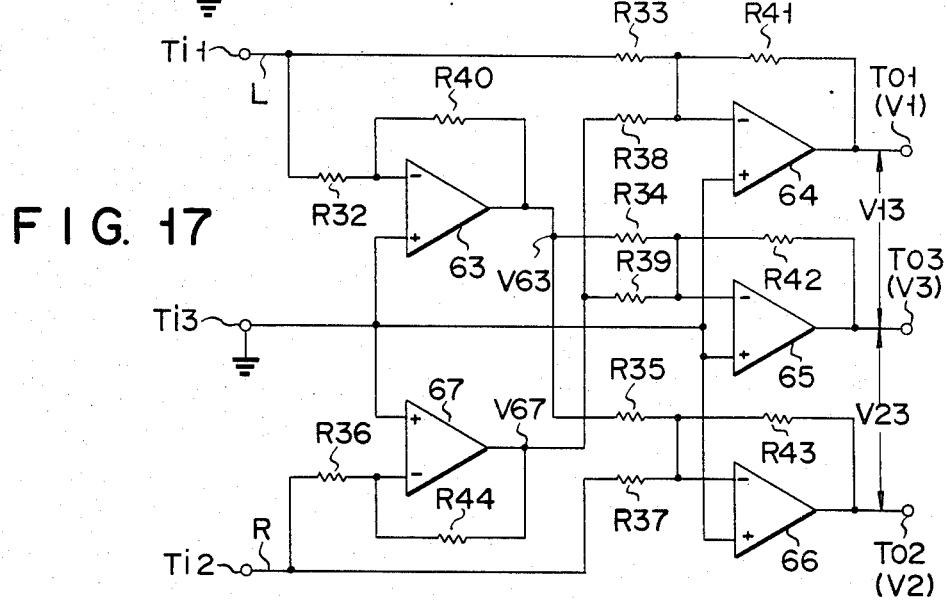
FIG. 17 shows another circuit diagram embodying the configuration of FIG. 1.

FIG. 17 shows another (alternative) detailed circuit arrangement of the circuit 1 in FIG. 1. In FIG. 17, input terminal Ti1 is coupled via a resistor R32 to the inverted input of an amplifier 63 and via a resistor R33 to the inverted input of an amplifier 64. The output of amplifier 63 is coupled via a resistor R40 to the inverted input thereof and respectively via resistors R34 and R35 to the inverted inputs of amplifiers 65 and 66. Input terminal Ti2 is coupled via a resistor R36 to the inverted input of an amplifier 67 and via a resistor R37 to the inverted input of amplifier 66. The output of amplifier 67 is coupled via a resistor R44 to the inverted input thereof and respectively via resistors R38 and R39 to the inverted inputs of amplifiers 64 and 65. The output of amplifier 64 is coupled via a resistor R41 to its inverted input, the output of amplifier 65 is coupled via a resistor R42 to its inverted input, and the output of amplifier 66 is coupled via a resistor R43 to its inverted input. The outputs of amplifiers 64, 66 and 65 are connected to output terminals To1, To2 and To3, respectively. Input terminal Ti3 which is circuit-grounded is connected to the noninverted inputs of amplifiers 63 to 67.

In the circuit shown in FIG. 17, when the L and R channel signals are respectively supplied to input terminals Ti1 and Ti2, output voltage V63 of amplifier 63 is given as follows:

$$V63 = -(R40/R32)L \tag{62}$$

Output voltage V67 of amplifier 67 is given as follows:

$$V67 = -(R44/R36)R \tag{63}$$

Then, output V1 of amplifier 64 is:

$$\begin{aligned} V1 &= -R41(L/R33 + V67/R38) \\ &= -(R41/R33)L + (R41/R38)(R44/R36)R \end{aligned} \tag{64}$$

and output voltage V3 of amplifier 65 is:

$$\begin{aligned} V3 &= -R42(V63/R34 + V67/R39) \\ &= (R42/R34)(R40/R32)L + (R42/R39)(R44/R36)R \end{aligned} \tag{65}$$

and output voltage V2 of amplifier 66 is:

$$\begin{aligned} V2 &= -R43(V63/R35 + R/R37) \\ &= (R43/R35)(R40/R32)L - (R43/R37)R \end{aligned} \tag{66}$$

Potential difference V13 between output terminals To1 and To3 is given as follows:

$$\begin{aligned} V13 &= V1 - V3 \\ &= -\{R41/R33 + (R42/R34)(R40/R32)\}L \\ &\quad + (R44/R36)\{(R41/R38 - R42/R39)\}R \end{aligned} \tag{67}$$

Similarly, potential difference V23 between output terminals To2 and To3 is given as follows:

$$\begin{aligned} V23 &= V2 - V3 \\ &= (R40/R32)\{(R43/R35 - R42/R34)\}L \\ &\quad -\{R43/R37 + (R42/R39)(R44/R36)\}R \end{aligned} \tag{68}$$

Eqs. (67) and (68) may be represented as:

$$\begin{pmatrix} V13 \\ V23 \end{pmatrix} = \begin{pmatrix} -\{R41/R33 + (R42/R34)(R40/R32)\} & (R44/R36)(R41/R38 - R42/R39) \\ (R40/R32)(R43/R35 - R42/R34) & R43/R37 + (R42/R39)(R44/R36) \end{pmatrix} \begin{pmatrix} L \\ R \end{pmatrix} \tag{69}$$

When the following relations hold:

$$\left.\begin{array}{l} R41/R38 - R42/R39 = 0 \\ R43/R35 - R42/R43 = 0 \end{array}\right\} \tag{70}$$

then, non-crosstalk L and R channel signals are obtained from three output terminals To1 to To3.

When the following relations hold:

$$\left.\begin{array}{l} R41/R38 - R42/R39 > 0 \\ R43/R35 - R42/R34 > 0 \end{array}\right\} \tag{71}$$

then, a stereo wide effect can be obtained.

The detailed circuit arrangements have been thus exemplified to describe the present invention. Factors a to f for determining the matrices of first to third amplifier circuits 100, 200 and 300 are generally described.

When factors a to f are given as follows:

$$\left.\begin{array}{l} a = (k - 1)k \\ b = -1/k \\ c = -1/k \\ d = -1/k \\ e = -1/k \\ f = (k - 1)/k \end{array}\right\} \tag{72}$$

output voltage V1 to V3 respectively at output terminals To1 to To3 are given as follows:

$$\left.\begin{array}{l} V1 = (k - 1)L/k - R/k \\ V2 = -L/k + (k - 1)R/k \\ V3 = -L/k - R/k \end{array}\right\} \tag{73}$$

Assume that k=2 is given. Then, output voltages V1 to V3 are:

$$\left.\begin{array}{l} V1 = L/2 - R/2 \\ V2 = -L/2 + R/2 \\ V3 = -L/2 - R/2 \end{array}\right\} \tag{74}$$

Figure 18:
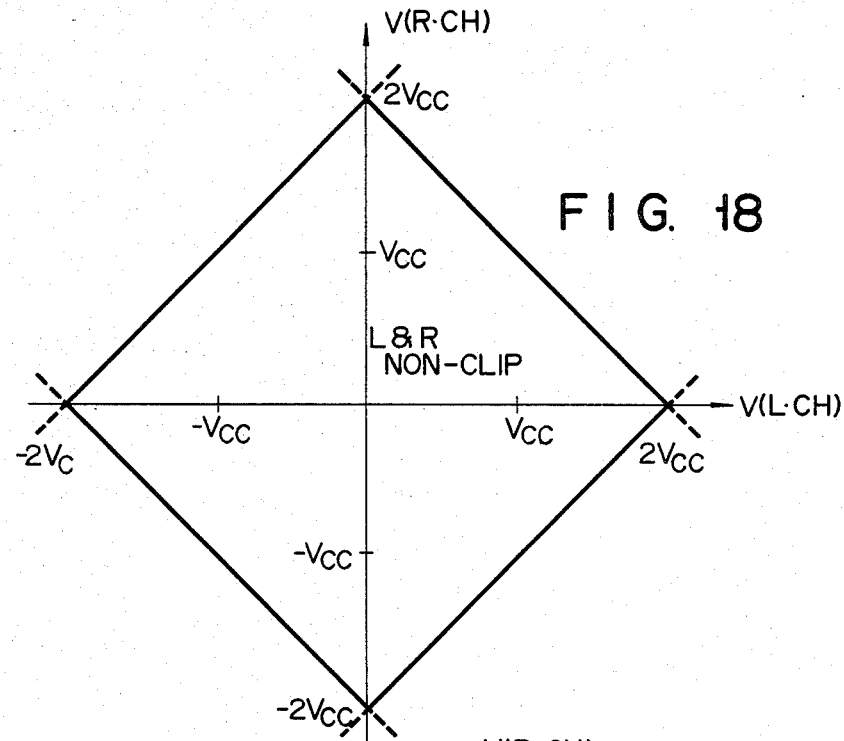
FIG. 18 illustrates an available non-clip output range of the circuit shown in FIG. 1.

In this case, $V1 + V2 = 0$. When the output voltages of L and R channel signals appearing between output terminals To1 and To3 and between output terminals To2 and To3 respectively satisfy the following conditions or fall within the range shown in FIG. 18:

$$\left.\begin{array}{l} -Vcc \leq L/2 - R/2 \leq Vcc \\ -Vcc \leq -L/2 + R/2 \leq Vcc \\ -Vcc \leq -L/2 - R/2 \leq Vcc \end{array}\right\} \tag{75}$$

then, no distortion or signal clipping occurs.

Assume that k=3 is given. In this case, output voltages V1 to V3 are $$\left.\begin{array}{l} V1 = 2L/3 - R/3 \\ V2 = -L/3 + 2R/3 \\ V3 = -L/3 - R/3 \end{array}\right\} \tag{76}$$

Figure 19:
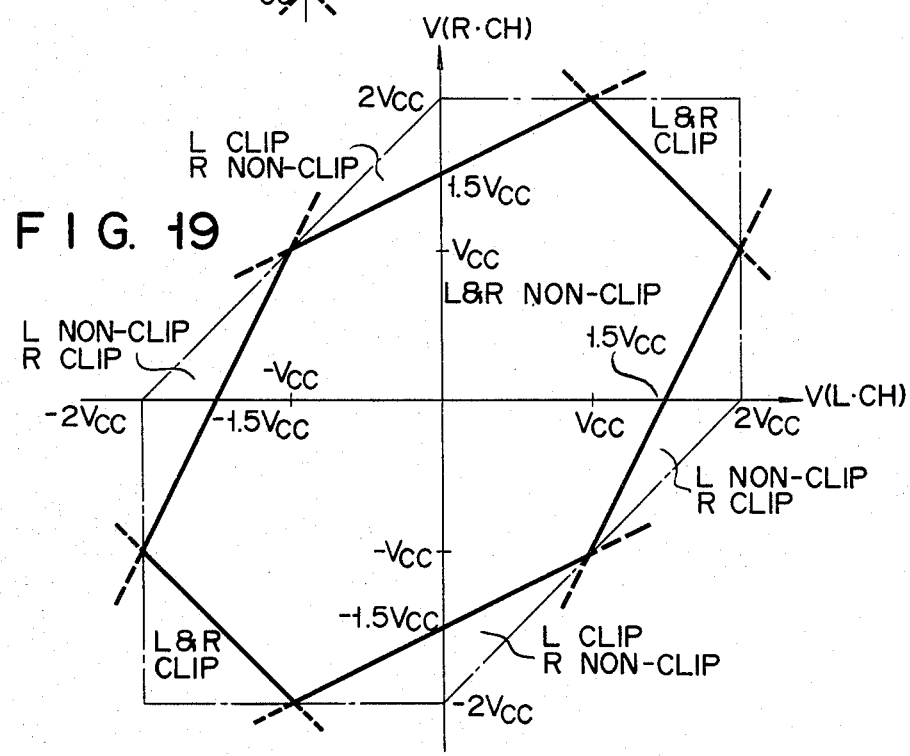
FIG. 19 illustrates another available non-clip output range of the circuit shown in FIG. 1.

In this case, $V1 + V2 = -V3$, and no distortion occurs when the output voltages of the L and R channel signals satisfy the following conditions or fall within the range indicated by the solid line in FIG. 19:

$$-Vcc \leq 2L/3 - R/3 \leq Vcc \\ -Vcc \leq -L/3 + 2R/3 \leq Vcc \\ -Vcc \leq -L/3 - R/3 \leq Vcc$$ (77)

Now consideration is given to the maximum output voltages of the L and R channel signals. When the sign of the output voltage of L channel signal is the same as that of the R channel signal, the following inequalities are given:

$$|V3| \geq |V1| \\ |V3| \geq |V2|$$ (78)

Output voltage V3 is clipped at power supply voltage Vcc or $-Vcc$. In this case, however, output voltages V1 and V2 are not clipped at the same sign, so that the output voltages of L and R channel signals increase until the following conditions are established:

$$|V1 - V3| = 2Vcc \\ |V2 - V3| = 2Vcc$$ (79)

When the output voltages of L and R channel signals have opposite signs, output voltages V1 and V2 also have opposite signs. Therefore, one of the output voltages of L and R channel signals is clipped before output voltage V3 is clipped. For this reason, when output voltages V1 and V2 are clipped at one of power supply voltages Vcc and $-Vcc$, the output voltages of L and R channel signals become maximum, as indicated by the alternate long and short dashed line in FIG. 19. These maximum output voltages are fixed for k>4.

The maximum output voltage is considered when the condition k=4 is given. In this case, output voltages V1 to V3 are given as follows:

$$V1 = 3L/4 - R/4 \\ V2 = -L/4 + 3R/4 \\ V3 = -L/4 - R/4$$ (80)

Figure 20:
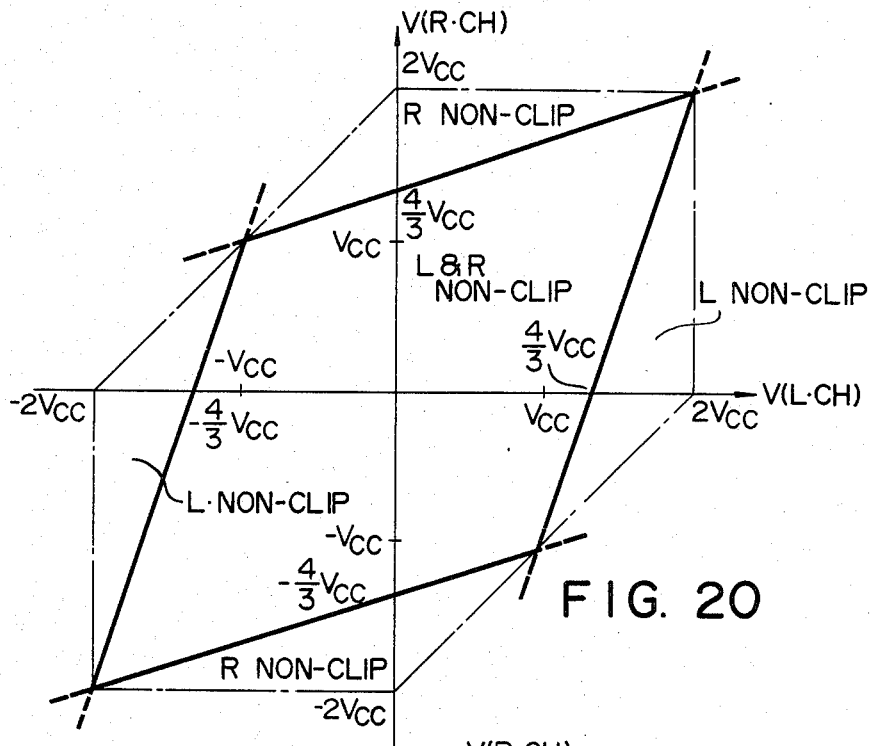
FIG. 20 illustrates another available non-clip output range of the circuit shown in FIG. 1.

No distortion occurs when the output voltages of L and R channel signals satisfy the following conditions or fall within the range indicated by the solid line in FIG. 20:

$$-Vcc \leq 3L/4 - R/4 \leq Vcc \\ -Vcc \leq -L/4 + 3R/4 \leq Vcc \\ -Vcc \leq -L/4 - R/4 \leq Vcc$$ (81)

In this case, when L=R is held, V1=V2=$-$V3 is established. In other words, the output voltages V1 to V3 are simultaneously subjected to clipping.

When k=5 is given, output voltages V1 to V3 are given as follows:

$$V1 = 4L/5 - R/5 \\ V2 = -L/5 + 4R/5 \\ V3 = -L/5 - R/5$$ (82)

Figure 21:
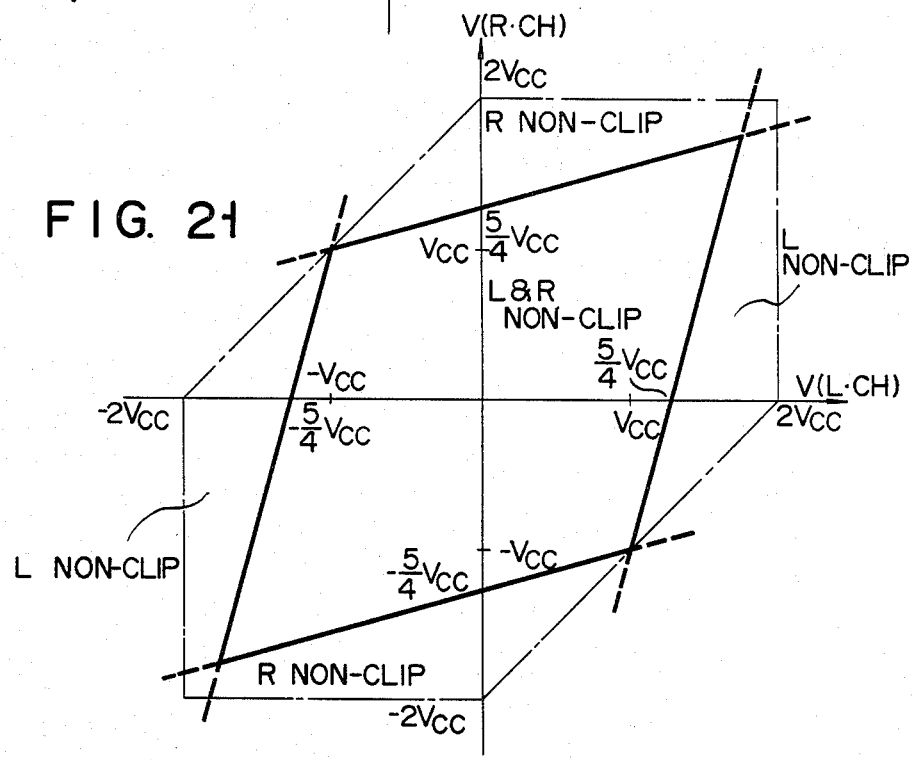
FIG. 21 illustrates another available non-clip output range of the circuit shown in FIG. 1.

No distortion occurs when the output voltages of L and R channel signals satisfy the following conditions or fall within the range indicated by the solid line in FIG. 21:

$$-Vcc \leq 4L/5 - R/5 \leq Vcc \\ -Vcc \leq -L/5 + 4R/5 \leq Vcc \\ -Vcc \leq -L/5 - R/5 \leq Vcc$$ (83)

Figure 22:
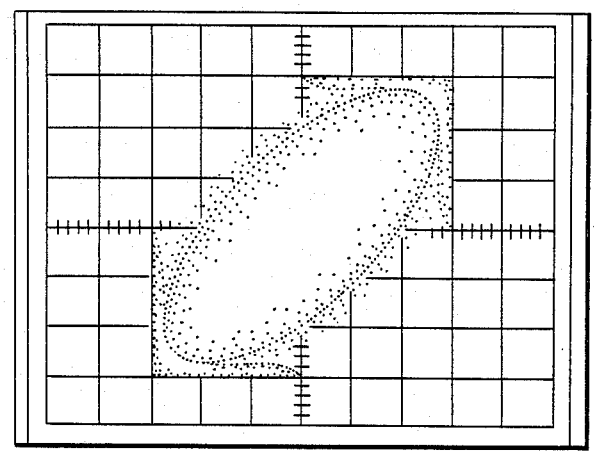
FIG. 22 shows photographic diagram of an oscilloscope in which a maximum non-clip operation range of the circuit of FIG. 1 is displayed.

FIG. 22 shows an oscillogram indicating the nondistortion range and the maximum output power range (white portion) of actual music signals.

In the above description, the parameter k varies from 2 to 5. When the L and R channel signals are in-phase each other, the nondistortion range and the maximum output range are substantially the same as those of a conventional BTL circuit. When the L and R channel signals have opposite phases, the nondistortion range and the maximum output power range are somewhat narrower than those of the conventional BTL circuit. In actual music signals, however, the L and R channel signals have almost the same phase in low frequency region (bass). The bass is generally reproduced with high power at the center (i.e., L=R) of the stereo reproduction sound image. For this reason, the stereo amplifier circuit of the present invention may have substantially the same nondistortion range and maximum output power range as those of the conventional BTL circuit. As a result, the stereo amplifier circuit of the invention is well adapted for use in high-power stereo headphones having 3-terminal inputs.

The maximum power output will be described hereinafter. An output power Po is generally given as follows:

$$Po = V^2/r$$ (84)

where r is the load resistance. Therefore, the power output of L and R channel signals can be expressed as follows:

$$Po = (L^2 + R^2)/r$$ (85)

The maximum power output can be readily understood in accordance with the above equation and the maximum output voltages shown in FIGS. 19 to 22.

Now the nondistorted maximum power output is considered in a case where the L channel signal has the same level as that of the R channel signal. Maximum power Pomax of the conventional stereo amplifier circuit is given as:

$$Pomax = \{(Lmax(rms))^2 + (Rmax(rms))^2\}/r \\ = \{(Vcc/\sqrt{2})^2 + (Vcc/\sqrt{2})^2\}/r \\ = Vcc^2/r$$ (86)

Maximum power Pomax of a BTL circuit is given as:

$$Pomax = \{(2Vcc/\sqrt{2})^2 + (2Vcc/\sqrt{2})^2\}/r \\ = 4Vcc^2/r$$ (87)

In the stereo amplifier circuit of the present invention, when L=R and k≦4 are given, V3

($=-L/k-R/k$) is first clipped as previously described. For this reason, $|V3|<Vcc$ is given, so that $$L=R=\pm kVcc/2 \text{ (Vpeak)} \quad (88)$$

Therefore, maximum power Pomax of the stereo amplifier circuit according to the present invention is:

$$Pomax = \{(\pm kVcc/2\sqrt{2})^2 + (\pm kVcc/2\sqrt{2})^2\}/r \quad (89)$$
$$= k^2Vcc^2/4r$$

Figure 23:
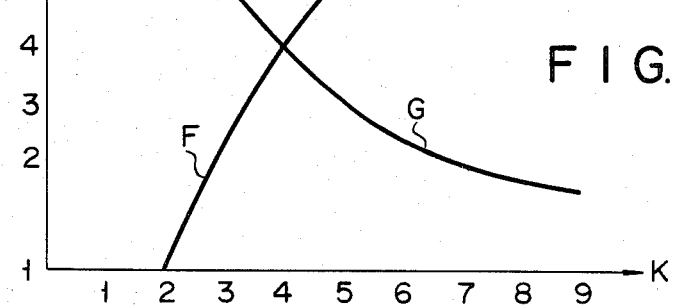
FIG. 23 illustrates output power curves explaining the maximum power of the circuit of FIG. 1.

In this manner, the maximum power is indicated by a curve F in FIG. 23.

On the other hand, when $k>4$ is given, the absolute values of output voltages V1 and V2 are given as follows:

$$|V1|=|V2|=|(k-2)L/k|<Vcc \text{ (for L=R)} \quad (90)$$

Then, $$L=R=+kVcc/(k-2) \text{ (Vpeak)} \quad (91)$$

Therefore, $$Pomax = \{(\pm kVcc/(k-2)\sqrt{2})^2 + (\pm kVcc/(k-2)\sqrt{2})^2\}/r \quad (92)$$
$$= k^2Vcc^2/r(k-2)^2$$

The maximum power in this case is indicated by a curve G in FIG. 23.

The maximum power output disregarding the distortion is given below:

$$Pomax=4Vcc^2/r \text{ (for } k>2\text{)} \quad (93)$$

A case will be described wherein $L=R$ is given. In this case, R channel signal varies when the maximum amplitude is given as $|L|$, so that R/L is used as a parameter. Under this condition, L is analogous to R, and the signs of the L and R channels can be disregarded. The parameter falls within the following range so as to satisfy the condition:

$$-1<R/L<1 \quad (94)$$

Under this condition, maximum power Pomax of a conventional stereo amplifier circuit is:

$$Pomax = [(Vcc/\sqrt{2})^2\{1 + (R/L)^2\}]/r \quad (95)$$

In the case of a BTL circuit, $$Pomax = [(2Vcc/\sqrt{2})^2\{1 + (R/L)^2\}]/r \quad (96)$$

On the other hand, in the stereo amplifier circuit of the present invention, when output voltage V3 ($=-L/k-R/k$) is first clipped under the condition $k<4$, the following condition is given:

$$|V3|=|-L/k-R/k|=|-(1+R/L)L/k|<Vcc \quad (97)$$

Therefore, $$Pomax = (1/r)\{(kVcc/\sqrt{2}(1 + R/L))^2\{1 + (R/L)^2\} \quad (98)$$

However, when output voltage $|V1|=|(k-1)L/k-R/k|$ is first clipped, the following condition is given:

$$|V1|=|(k-1)L/k-R/k|=|(1/k)(k-1-R/L)L| \\ <Vcc \quad (99)$$

Therefore, $$Pomax = (1/r)[kVcc/\{\sqrt{2}(k-1-R/L)\}]^2\{1 + (R/L)^2\} \quad (100)$$

Figure 24:
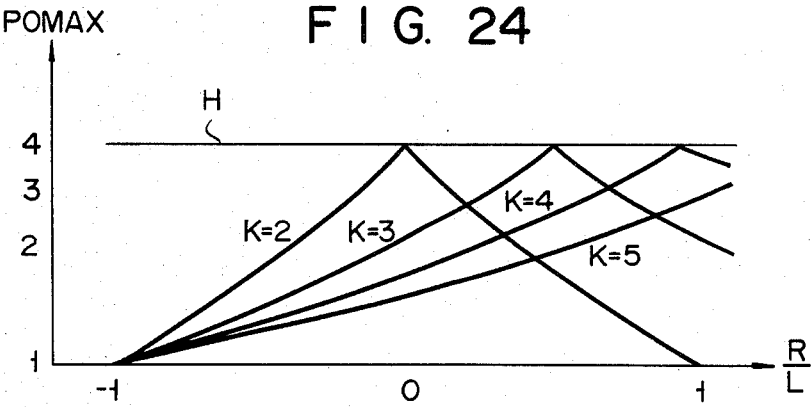
FIG. 24 illustrates other output power curves explaining the maximum power of the circuit of FIG. 1.

FIG. 24 is a graph showing normalized values wherein maximum power Pomax of a conventional stereo amplifier circuit having a single-end output stage is given as "1". Line H in FIG. 24 indicates maximum power Pomax of a BTL circuit.

Eqs. (98) and (100) include nondistortion conditions. When distortions are disregarded, under the condition $k>2$, the maximum power output is given as:

$$Pomax = (1/r)\{\sqrt{2} Vcc/(1 - R/L)\}^2\{1 + (R/L)^2\} \quad (101)$$
$$\text{(for } -1 \leq R/L \leq 0\text{)}$$

and $$Pomax = (1/r)(2Vcc/\sqrt{2})^2\{1 + (R/L)^2\} \quad (102)$$
$$\text{(for } 0 \leq R/L \leq 1\text{)}$$

Figure 25:
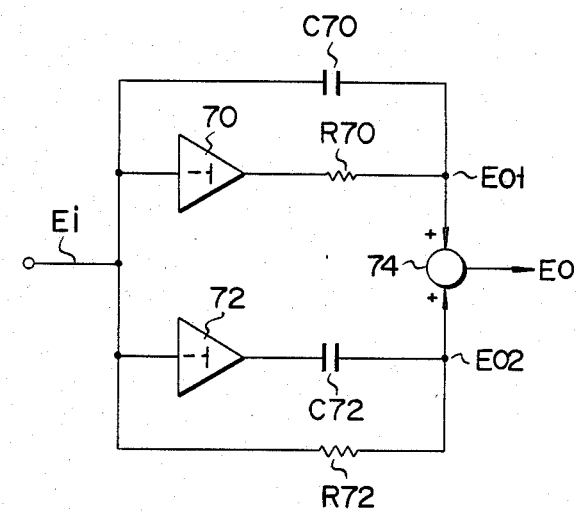
FIG. 25 shows a phase shifter used in the block configuration of FIGS. 9 to 12.

FIG. 25 shows a phase shifter used in the configuration of FIGS. 9 to 12. An input signal Ei is supplied to inverting amplifiers 70 and 72. Signal Ei is also supplied via a capacitor C70 to one input of an analog adder 74 and via a resistor R72 to the other input of adder 74. The output of amplifier 70 is coupled via a resistor R70 to the one input of adder 74, and the output of amplifier 72 is coupled via a capacitor C72 to the other input of adder 74. A phase-shifted output Eo is obtained from adder 74. Elements 70, R70 and C70 constitute a phase-advancing shifter which provide an output Eo1. Elements 72, R72 and C72 constitute a phase-delaying shifter which provide an output Eo2. Output Eo corresponds to the sum of Eo1 and Eo2.

Figure 26:
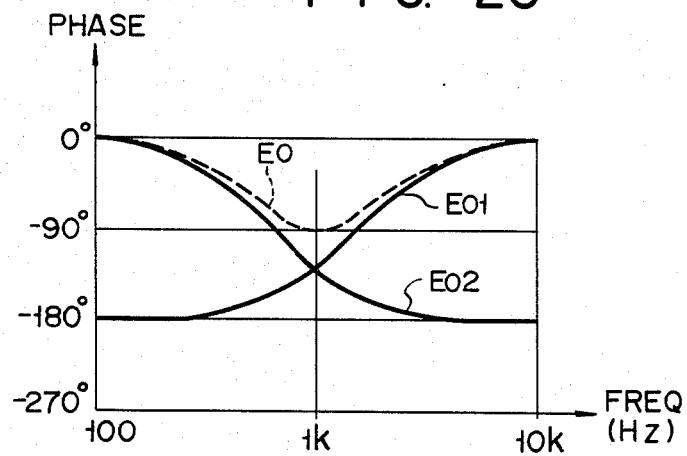
FIG. 26 illustrates phase shifting characteristics of the phase shifter shown in FIG. 25.

FIG. 26 shows phase-frequency characteristics of outputs Eo1, Eo2 and Eo. As seen from FIG. 26, the phase of output Eo1 with respect to the phase of input Ei advances from $-180$ degrees toward 0 degrees as the frequency of Ei becomes high, while the phase of output Eo2 with respect to the phase of input Ei delays from 0 degrees toward $-180$ degrees as the frequency of Ei becomes high. Then, the output Eo comes to have phase-delay of about $-90$ degrees around mid frequency (1 kHz). Incidentally, the phase shift amount of output Eo may be freely selected.

Figure 27A:
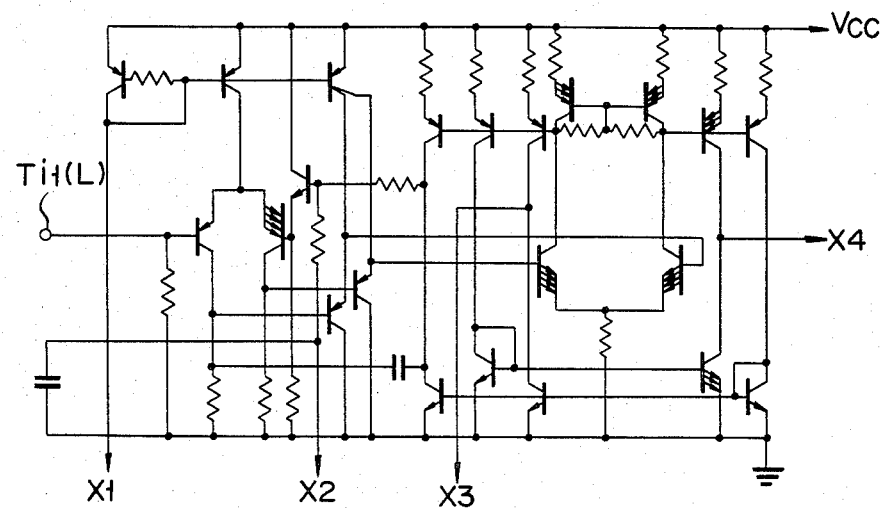
FIGS. 27A to 27D jointly show a detailed circuit configuration of the circuit of FIG. 1.
Figure 27B:
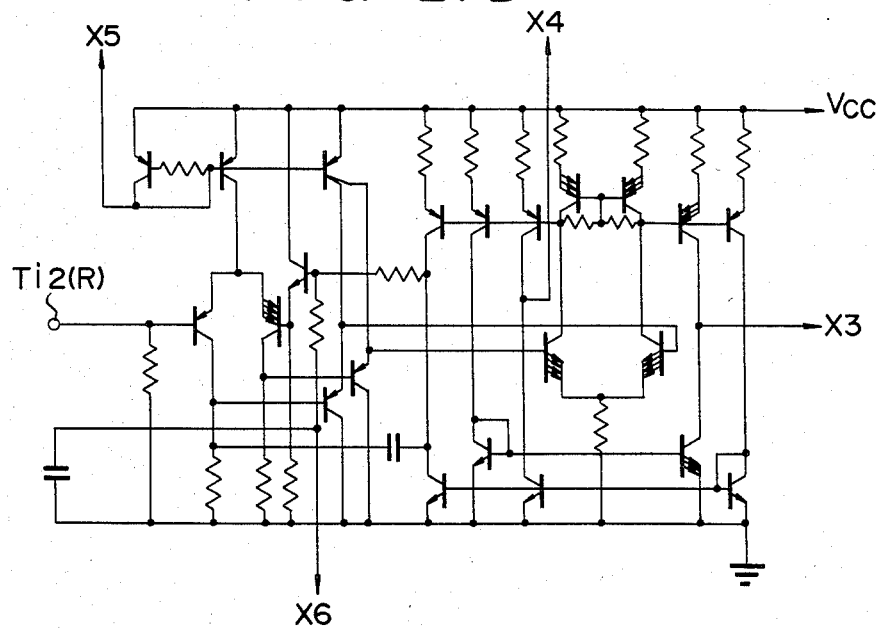
Figure 27C:
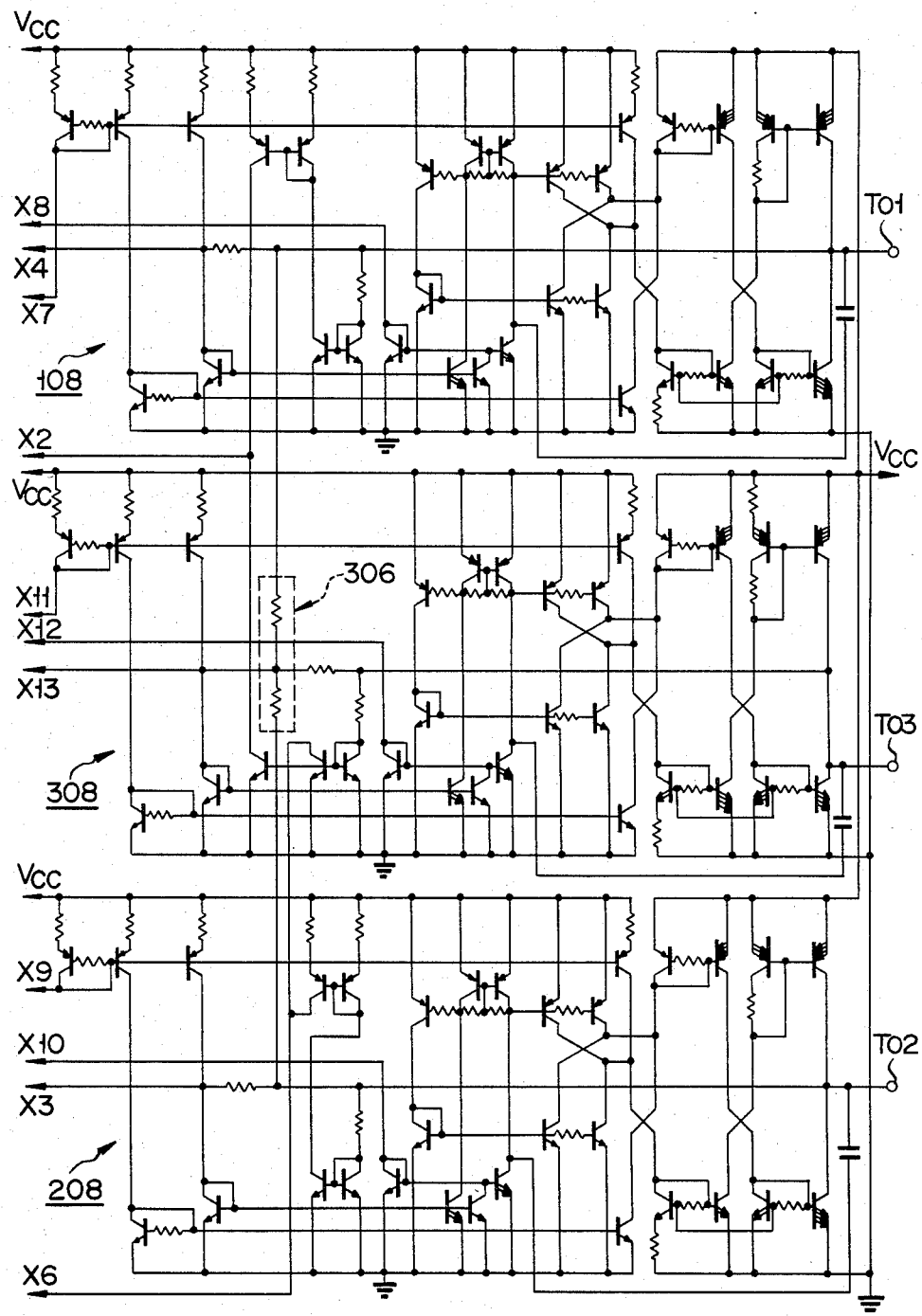
Figure 27D:
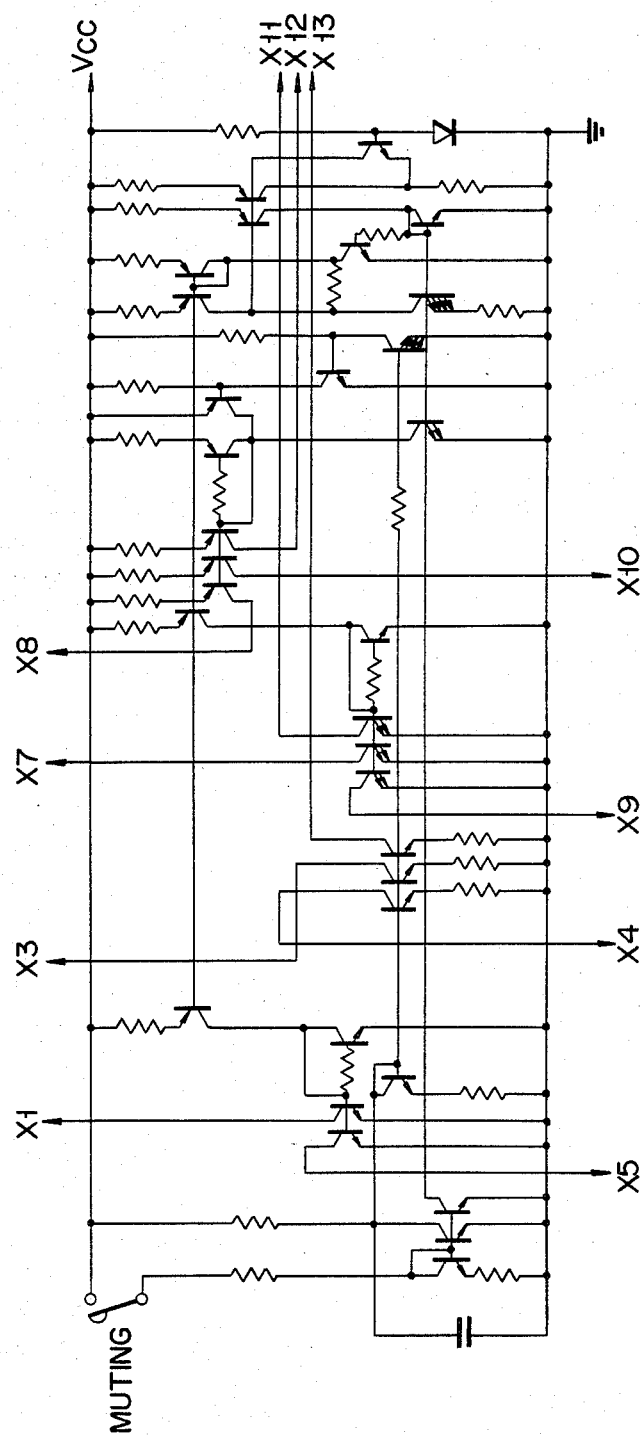

FIGS. 27A to 27D jointly show detailed circuit configuration of the circuit 1 in FIG. 1, which is suitable for the circuit-integration. Particularly, the circuit of FIGS. 27A to 27D corresponds to the configuration of FIG. 5. In FIGS. 27A to 27D, the same symbols (e.g., X1, X2, etc.) should be coupled each other so as to complete the circuit 1 of FIG. 1. FIG. 27A chiefly represent an L-channel input buffer amplifier and coefficient multipliers 102 and 202 of FIG. 5. FIG. 27B chiefly represent an R-channel input buffer amplifier and coefficient multipliers 104 and 204. FIG. 27C chiefly represent power amplifiers 108, 208 and 308; coefficient multipliers 302 and 304; and adder 306. FIG. 27D shows a biasing circuit for the circuitry of FIGS. 27A to 27C. Since the circuit connection shown in FIGS. 27A to 27D is quite clear, detailed description therefor is omitted here.

The present invention is not limited to the above embodiment. Various changes and modifications may be made within the scope of the present invention.

According to the present invention, the amplitude of 2-channel or bichannel stereo signals is prominently increased for the rated power supply voltage and these stereo signals are obtained from 3-terminal outputs. Therefore, a high-performance stereo reproduction apparatus being suitable for 3-terminal stereo headphones can be embodied according to the stereo amplifier circuit of the present invention. Of course, the present invention may be applied to a multichannel amplifier circuit having four or more output terminals.

What is claimed is:

1. A stereo amplifier circuit comprising:
   first circuit means responsive to a first input signal and to a second input signal, for generating a first output signal which corresponds to the potential difference between said first input signal and said second input signal;
   second circuit means responsive to said first and second input signals, for generating a second output signal which corresponds to the potential difference between said second input signal and said first input signal;
   third circuit means responsive to said first and second input signals, for generating a third output signal which corresponds to the sum of said first and second input signals, said third output signal containing signal components being antiphase to said first and second input signals; and
   output circuit means coupled to said first to third circuit means, for providing a first differential output signal corresponding to the potential difference between said first and third output signals, and providing a second differential output signal corresponding to the potential difference between said second and third output signals.

2. A circuit according to claim 1, wherein said first circuit means includes:
   a first multiplier for multiplying said first input signal with a first coefficient and providing a first weighted signal;
   a second multiplier for multiplying said second input signal with a second coefficient and providing a second weighted signal;
   a first subtracter coupled to said first and second multipliers, for subtracting said second weighted signal from said first weighted signal and porviding a first combination signal; and
   a first power amplifier coupled to said first subtracter, for power-amplifying said first combination signal with a first amplification factor and providing said first output signal.

3. A circuit according to claim 2, wherein said second circuit means includes:
   a third multiplier for multiplying said second input signal with a third coefficient and providing a third weighted signal;
   a fourth multiplier for multiplying said first input signal with a fourth coefficient and providing a fourth weighted signal;
   a second subtracter coupled to said third and fourth multipliers, for subtracting said fourth weighted signal from said third weighted signal and porviding a second combination signal; and
   a second power amplifier coupled to said second subtracter, for power-amplifying said second combination signal with a second amplification factor and providing said second output signal.

4. A circuit according to claim 3, wherein said third circuit means includes:
   a fifth multiplier for multiplying said first input signal with a fifth coefficient and providing a fifth weighted signal;
   a sixth multiplier for multiplying said second input signal with a sixth coefficient and providing a sixth weighted signal;
   an adder coupled to said fifth and sixth multipliers, for adding said fifth weighted signal to said sixth weighted signal and providing an added signal; and
   a third power amplifier coupled to said adder, for phase-invertedly power-amplifying said added signal with a third amplification factor and providing said third output signal, said first differential output signal being equal to the potential difference between said first and third output signals and said second differential output signal being equal to the potential difference between said second and third output signals.

5. A circuit according to claim 3, wherein said third circuit means includes:
   a fifth multiplier for multiplying said first combination signal with a fifth coefficient and providing a fifth weighted signal;
   a sixth multiplier for multiplying said second combination signal with a sixth coefficient and providing a sixth weighted signal;
   an adder coupled to said fifth and sixth multipliers, for adding said fifth weighted signal to said sixth weighted signal and providing an added signal; and
   a third power amplifier coupled to said adder, for phase-invertedly power-amplifying said added signal with a third amplification factor and providing said third output signal, said first differential output signal being equal to the potential difference between said first and third output signals and said second differential output signal being equal to the potential difference between said second and third output signals.

6. A circuit according to claim 3, wherein said third circuit means includes:
   a fifth multiplier for multiplying said first output signal with a fifth coefficient and providing a fifth weighted signal;
   a sixth multiplier for multiplying said second output signal with a sixth coefficient and providing a sixth weighted signal;
   an adder coupled to said fifth and sixth multipliers, for adding said fifth weighted signal to said sixth weighted signal and providing an added signal; and
   a third power amplifier coupled to said adder, for phase-invertedly power-amplifying said added signal with a third amplification factor and providing said third output signal, said first differential output signal being equal to the potential difference between said first and third output signals and said second differential output signal being equal to the potential difference between said second and third output signals.

7. A circuit according to claim 1, wherein said third circuit means includes:
an adder for adding said first input signal to said second input signal and providing an added signal;
a multiplier coupled to said adder, for multiplying said added signal with a given coefficient and providing a weighted signal; and
an inverting power amplifier coupled to said multiplier, for phase-invertedly power-amplifying said weighted signal with a given amplification factor and providing said third output signal, said first differential output signal being equal to the potential difference between said first and third output signals and said second differential output signal being equal to the potential difference between said second and third output signals.

8. A circuit according to claim 7, wherein said first circuit means includes:
a first multiplier coupled to said adder, for multiplying said added signal with a first coefficient and providing a first weighted signal;
a first subtracter coupled to said first multiplier, for subtracting said first weighted signal from said first input signal and providing a first combination signal; and
a first power amplifier coupled to said first subtracter, for power-amplifying said first combination signal with a first amplification factor and providing said first output signal.

9. A circuit according to claim 8, wherein said second circuit means includes:
a second multiplier coupled to said adder, for multiplying said added signal with a second coefficient and providing a second weighted signal;
a second subtracter coupled to said second multiplier, for subtracting said second weighted signal from said second input signal and porviding a second combination signal; and
a second power amplifier coupled to said second subtracter, for power-amplifying said second combination signal with a second amplification factor and providing said second output signal.

10. A circuit according to claim 7, wherein said first circuit means includes:
a first multiplier coupled to said inverting power amplifier, for multiplying said third output signal with a first coefficient and providing a first weighted signal;
a first adder coupled to said first multiplier, for adding said first weighted signal to said first input signal and providing a first combination signal; and
a first power amplifier coupled to said first adder, for power-amplifying said first combination signal with a first amplification factor and providing said first output signal.

11. A circuit according to claim 10, wherein said second circuit means includes:
a second multiplier coupled to said inverting power amplifier, for multiplying said third output signal with a second coefficient and providing a second weighted signal;
a second adder coupled to said second multiplier, for adding said second weighted signal to said second input signal and porviding a second combination signal; and
a second power amplifier coupled to said second adder, for power-amplifying said second combination signal with a second amplification factor and providing said second output signal.

12. A circuit according to claim 7, wherein said third circuit means further includes:
a phase shifter coupled to said multiplier, for phase-shifting said weighted signaland providing a phase-shifted signal to said inverting power amplifier.

13. A circuit according to claim 4, wherein said first to sixth coefficients are so determined that said first differential output signal corresponds only to said first input signal and that said second differential output signal corresponds only to said second input signal.

14. A circuit according to claim 4, wherein said first to sixth coefficients are so determined that said first differential output signal contains a signal component of said first input signal and a signal component of said second input signal which has an antiphase relation to the signal component of said first input signal, and are so determined that said second differential output signal contains a signal component of said second input signal and a signal component of said first input signal which has an antiphase relation to the signal component of said second input signal.

15. A circuit according to claim 1, wherein said first circuit means includes:
a first attenuator for attenuating said first input signal with a first attenuation degree and providing a first attenuated signal;
a second attenuator for attenuating said second input signal with a second attenuation degree and providing a second attenuated signal; and
a first amplifier having a noninverted input for receiving said first attenuated signal and an inverted input for receiving said second attenuated signal, for providing said first output signal which corresponds to the difference between said first and second attenuated signals;
wherein said second circuit means includes:
a third attenuator for attenuating said second input signal with a third attenuation degree and providing a third attenuated signal;
a fourth attenuator for attenuating said first input signal with a fourth attenuation degree and providing a fourth attenuated signal; and
a second amplifier having a noninverted input for receiving said third attenuated signal and an inverted input for receiving said fourth attenuated signal, for providing said second output signal which corresponds to the difference between said third and fourth attenuated signals;
and wherein said third circuit means includes:
a fifth attenuator for attenuating said first input signal with a fifth attenuation degree, attenuating said second input signal with a sixth attenuation degree, and providing a fifth attenuated signal; and
a third amplifier having a noninverted input for receiving a circuit ground potential and an inverted input for receiving said fifth attenuated signal, for providing said third output signal which is antiphasic to said fifth attenuated signal.

16. A stereo amplifier circuit comprising:
first circuit means, responsive to first and second input signals, for generating a first output signal which corresponds to the potential difference between said first and second input signals;

second circuit means, responsive to said first and second input signals, for generating a second output signal which corresponds to the potential difference between said second and first input signals;

third circuit means, responsive to said first and second input signals, for generating a third output signal which corresponds to the sum of said first and second input signals, said third output signal containing signal components being antiphase to said first and second input signals;

output circuit means coupled to said first to third circuit means, for providing a first differential output signal corresponding to the potential difference between said first and third output signals, and providing a second differential output signal corresponding to the potential difference between said second and third output signals;

wherein said first circuit means includes:
  a first transistor having a base receiving said first input signal, a collector coupled to a power source potential and an emitter coupled to a first current source;
  a second transistor having a base receiving a zero-AC potential, a collector coupled via a first collector resistor to said power source potential and an emitter coupled to said first current source; and
  a third transistor having a base receiving said second input signal, a collector coupled to the collector of said second transistor and an emitter coupled to a second current source;

wherein said second circuit means includes:
  a fourth transistor having a base receiving said second input signal, a collector coupled to said power source potential and an emitter coupled to said second current source;
  a fifth transistor having a base receiving said zero-AC potential, a collector coupled via a second collector resistor to said power source potential and an emitter coupled to said second current source; and
  a sixth transistor having a base receiving said first input signal, a collector coupled to the collector of said fifth transistor and an emitter coupled to said first current source;

and wherein said third circuit means includes:
  a seventh transistor having a base receiving said first input signal, a collector coupled via a third collector resistor to said power source potential and an emitter coupled to said first current source; and an eighth transistor having a base receiving said second input signal, a collector coupled to the collector of said seventh transistor and an emitter coupled to said second source, and wherein said first output signal is obtained from the collectors of said second and third transistors, said second output signal is obtained from the collectors of said fifth and sixth transistors, and said third output signal is obtained from the collectors of said seventh and eighth transistors.

17. A stereo amplifier circuit comprising:

a first inverting amplifier for invertedly amplifying first input signal and outputting a first inverted signal;

a second inverting amplifier for invertedly amplifying second input signal and outputting a second inverted signal;

a first attenuator for attenuating said first input signal with a first attenuation degree and providing a first attenuated signal;

a second attenuator for attenuating said second inverted signal with a second attenuation degree and providing a second attenuated signal;

a third inverting amplifier having an inverting input for receiving said first and second attenuated signals, for providing first output signal;

a third attenuator for attenuating said second input signal with a third attenuation degree and providing a third attenuated signal;

a fourth attenuator for attenuating said first inverted signal with a fourth attenuation degree and providing a fourth attenuated signal;

a second amplifier having an inverting input for receiving said third and fourth attenuated signals, for providing a second output signal;

a fifth attenuator for attenuating said first inverted signal with a fifth attenuation degree, and providing a fifth attenuated signal;

a sixth attenuator for attenuating said second inverted signal with a sixth attenuation degree, and providing a sixth attenuated signal;

a third amplifier having an inverted input for receiving said fifth and sixth attenuated signals, for providing a third output signal; and output circuit means for providing a first differential output signal corresponding to the potential difference between said first and third output signals, and providing a second differential output signal corresponding to the potential difference said second and third output signals.

* * * * *